United States Patent
Kainuma et al.

(10) Patent No.: US 10,261,249 B2
(45) Date of Patent: Apr. 16, 2019

(54) OPTICAL MODULE AND METHOD OF MANUFACTURING OPTICAL MODULE

(71) Applicant: FUJITSU LIMITED, Kawasaki-shi, Kanagawa (JP)

(72) Inventors: Norio Kainuma, Nagano (JP); Naoaki Nakamura, Kawasaki (JP); Kenji Fukuzono, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/785,466

(22) Filed: Oct. 17, 2017

(65) Prior Publication Data

US 2018/0156972 A1 Jun. 7, 2018

(30) Foreign Application Priority Data

Dec. 1, 2016 (JP) .................... 2016-233738

(51) Int. Cl.
*G02B 6/12* (2006.01)
*H05K 3/46* (2006.01)
(Continued)

(52) U.S. Cl.
CPC .......... *G02B 6/12004* (2013.01); *G02B 6/122* (2013.01); *G02B 6/428* (2013.01); *G02B 6/4272* (2013.01); *G02B 6/4283* (2013.01); *H05K 1/0204* (2013.01); *H05K 1/0274* (2013.01); *H05K 1/181* (2013.01); *H05K 3/3436* (2013.01); *H05K 3/4626* (2013.01); *H05K 3/4697* (2013.01); *G02B 2006/12121* (2013.01);
(Continued)

(58) Field of Classification Search
CPC ............ G02B 66/12004; G02B 66/428; G02B 2006/12121; G02B 2006/12123; H05K 1/0204; H05K 1/0274; H05K 1/181; H05K 3/3486; H05K 3/4626; H05K 3/4697
See application file for complete search history.

(56) References Cited

U.S. PATENT DOCUMENTS

2003/0222344 A1* 12/2003 Hosoyamada ...... H01L 23/3128
                                                            257/738
2014/0027891 A1*  1/2014 Kimura ............... H01L 23/3107
                                                            257/675
(Continued)

FOREIGN PATENT DOCUMENTS

JP    2000-352643    12/2000

OTHER PUBLICATIONS

Hayakawa et al., "A 25 Gbps silicon photonic transmitter and receiver with a bridge structure for CPU interconnects", Optical Fiber Communication Conference 2015 Los Angeles, California United States, Mar. 22-26, 2015 (3 pages).

*Primary Examiner* — Peter Radkowski
(74) *Attorney, Agent, or Firm* — Fujitsu Patent Center

(57) ABSTRACT

An optical module includes a first board that includes a recessed portion and a first conductor layer, a second board accommodated in the recessed portion and includes an optical waveguide and a second conductor layer, a semiconductor element installed across the first board and the second board and coupled to the first conductor layer and the second conductor layer, and a first bonding material disposed between a sidewall and a bottom surface of the recessed portion and the second board so as to bond the first board and the second board to each other.

7 Claims, 18 Drawing Sheets

(51) Int. Cl.
*H05K 1/02* (2006.01)
*H05K 1/18* (2006.01)
*G02B 6/42* (2006.01)
*H05K 3/34* (2006.01)
*G02B 6/122* (2006.01)

(52) U.S. Cl.
CPC ............ *G02B 2006/12123* (2013.01); *H05K 2201/10121* (2013.01); *H05K 2201/10151* (2013.01); *H05K 2201/10734* (2013.01)

(56) References Cited

U.S. PATENT DOCUMENTS

2016/0035952 A1* 2/2016 Yamada .................. H01L 24/48
 257/98
2016/0085038 A1* 3/2016 Decker ................ G02B 6/4204
 385/14

\* cited by examiner

OPTICAL MODULE AND METHOD OF MANUFACTURING OPTICAL MODULE

CROSS-REFERENCE TO RELATED APPLICATION

This application is based upon and claims the benefit of priority of the prior Japanese Patent Application No. 2016-233738, filed on Dec. 1, 2016, the entire contents of which are incorporated herein by reference.

FIELD

The embodiments discussed herein are related to an optical module and a method of manufacturing an optical module.

BACKGROUND

There has been known an optical module having a semiconductor element such as large scale integration (LSI) mounted on a mounting board such as a silicon substrate mounted with an optical waveguide, in addition to an optical element such as a light receiving element or a light emitting element. For example, there has been known an optical module, in which an LSI onto which a light receiving element is bonded via a solder bump is bonded onto a silicon substrate via a solder bump in the state in which the light receiving element is disposed in a recessed portion of the silicon substrate mounted with an optical waveguide.

When the mounting board mounted with the optical waveguide is mounted on a separate board and connected to the separate board by a wire in order to supply electrical signals to the semiconductor element on the mounting board mounted with the optical waveguide, a wiring length reaching the semiconductor element on the mounting board is increased, and as a result, a high-speed operation of the optical module may not be achieved.

The followings are reference documents.
[Document 1] Japanese Laid-Open Patent Publication No. 2000-352643, and
[Document 2] Akinori Hayakawa etc., "A 25 Gbps silicon photonic transmitter and receiver with a bridge structure for CPU interconnects", Optical Fiber Communication Conference 2015 Los Angeles, Calif. United States 22-26 March 2015.

SUMMARY

According to an aspect of the invention, an optical module includes a first board that includes a recessed portion and a first conductor layer, a second board accommodated in the recessed portion and includes an optical waveguide and a second conductor layer, a semiconductor element installed across the first board and the second board and coupled to the first conductor layer and the second conductor layer, and a first bonding material disposed between a sidewall and a bottom surface of the recessed portion and the second board so as to bond the first board and the second board to each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
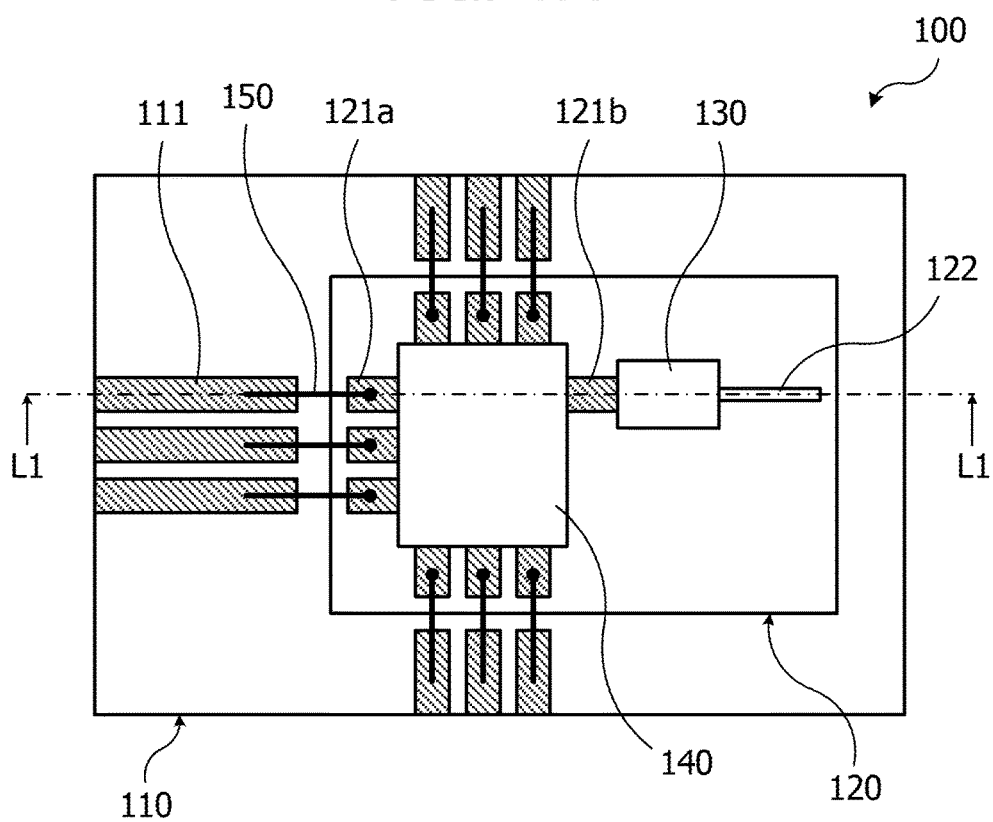
FIGS. 1A and 1B are views illustrating an example of an optical module.
Figure 1B:
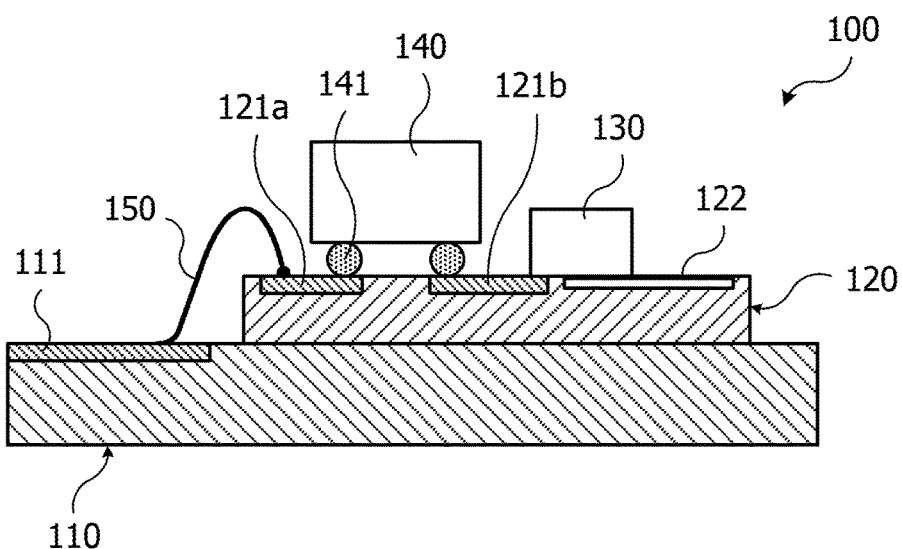

First, an example of an optical module will be described. FIGS. 1A and 1B are views illustrating an example of an optical module. FIG. 1A illustrates a schematic top plan view of a main part of the optical module, and FIG. 1B illustrates a schematic cross-sectional view taken along line L1-L1 in FIG. 1A.

An optical module 100 illustrated in FIG. 1 includes a board 110, a silicon photonics chip 120, a semiconductor laser 130, and a control chip 140. Various types of circuit boards such as a printed board, a package board, an interposer, and a motherboard are used for the board 110. As electric wiring, conductor layers 111 having predetermined patterns are provided on the board 110. The conductor layer 111 is formed by using various types of conductive materials such as copper (Cu).

The silicon photonics chip 120 is provided on the board 110. The silicon photonics chip 120 is formed by using a silicon (Si) substrate or a silicon-on-insulator (SOI) substrate. As electric wiring, conductor layers 121a and 121b having predetermined patterns are provided on the silicon photonics chip 120, and as optical wiring, an optical waveguide 122 having a predetermined pattern is provided on the silicon photonics chip 120. The conductor layers 121a and 121b are formed using various types of conductive materials such as copper. For example, the optical waveguide 122 is formed using silicon for a core, and silicon oxide ($SiO_2$) for a clad.

The semiconductor laser 130 is provided on the silicon photonics chip 120. For example, the semiconductor laser 130 is formed using various types of compound semiconductor materials such as a gallium arsenide (GaAs) based material, an indium phosphide (InP) based material, and a gallium nitride (GaN) based material. Here, a surface emitting laser such as a vertical cavity surface emitting laser (VCSEL) is exemplified as the semiconductor laser 130.

The semiconductor laser 130 is electrically connected to the conductor layer 121b of the silicon photonics chip 120. Light is emitted from the semiconductor laser 130 using an electrical signal (electric current or voltage) supplied to the semiconductor laser 130 through the conductor layer 121b. The semiconductor laser 130 is optically connected to the optical waveguide 122 of the silicon photonics chip 120, and the emitted light is coupled to the optical waveguide 122.

The control chip 140 is provided on the silicon photonics chip 120. Various types of semiconductor elements such as the LSI are used as the control chip 140. The control chip 140 is electrically connected to the conductor layers 121a and 121b of the silicon photonics chip 120 by terminal joint portions 141 such as solder bumps (flip chip bonding). The control chip 140 controls the electrical signal to be supplied to the semiconductor laser 130 through the conductor layer 121b, and controls the ON/OFF operation of the light of the semiconductor laser 130.

The light, which is controlled by the control chip 140 and emitted from the semiconductor laser 130, is transmitted to the optical waveguide 122 of the silicon photonics chip 120, and for example, the light is transmitted to another optical element such as an optical fiber optically connected to the optical waveguide 122.

The conductor layers 111 of the board 110 and the conductor layers 121a of the silicon photonics chip 120 are electrically connected to the optical module 100 illustrated in FIGS. 1A and 1B using wires 150 (wire bonding). The electrical signal, which is transmitted to the control chip 140 for controlling the ON/OFF operation of the light of the semiconductor laser 130, is supplied from the outside of the silicon photonics chip 120 on which the control chip 140 and the semiconductor laser 130 are mounted. In this example, the electrical signal is supplied from the board 110 on which the silicon photonics chip 120 is mounted. That is, the electrical signal to the control chip 140 is supplied through the conductor layer 111 of the board 110, the wires 150, and the conductor layers 121a of the silicon photonics chip 120.

By the way, an optical communication speed is progressively increasing according to as the recent increase of a data amount. In order to increase the optical communication speed, it is required to increase the speed of the operation of an outgoing light source and the speed of the operation of a semiconductor element for controlling the outgoing light source. However, in the optical module 100, there is a possibility that a sufficient high-speed operation may not be achieved due to the structure of the electrical signal path.

Figure 2A:
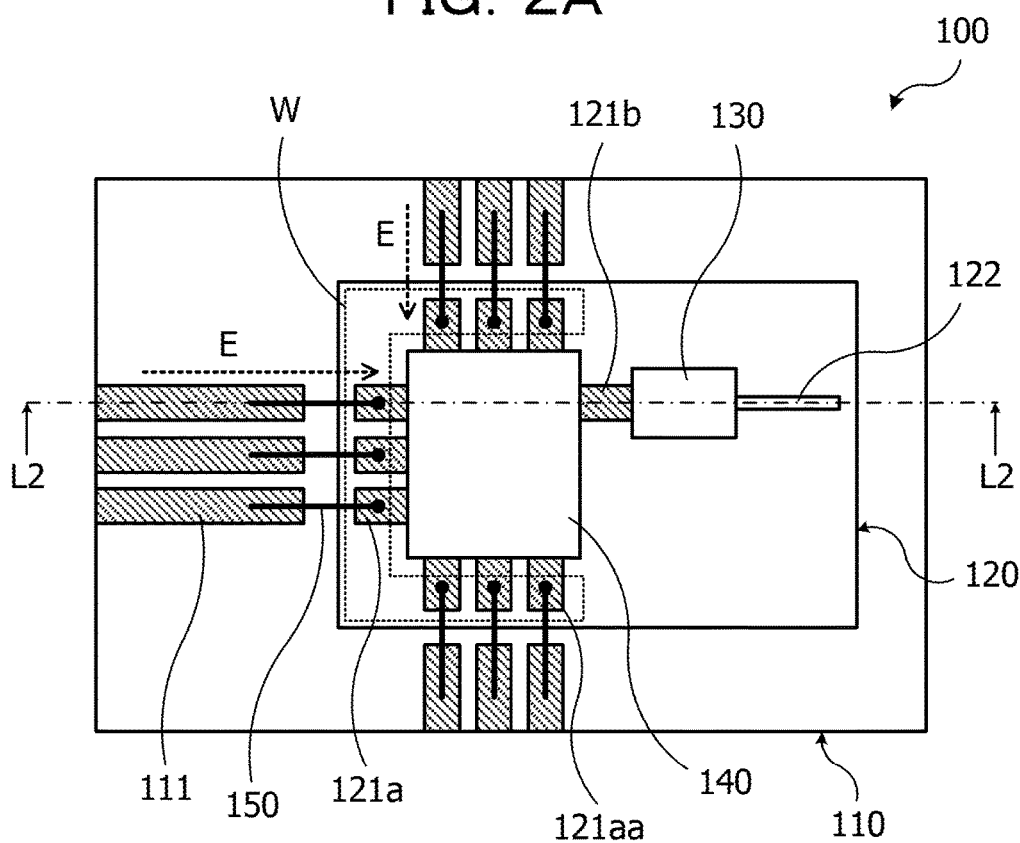
FIGS. 2A and 2B are explanatory views of an electrical signal path of the optical module.
Figure 2B:
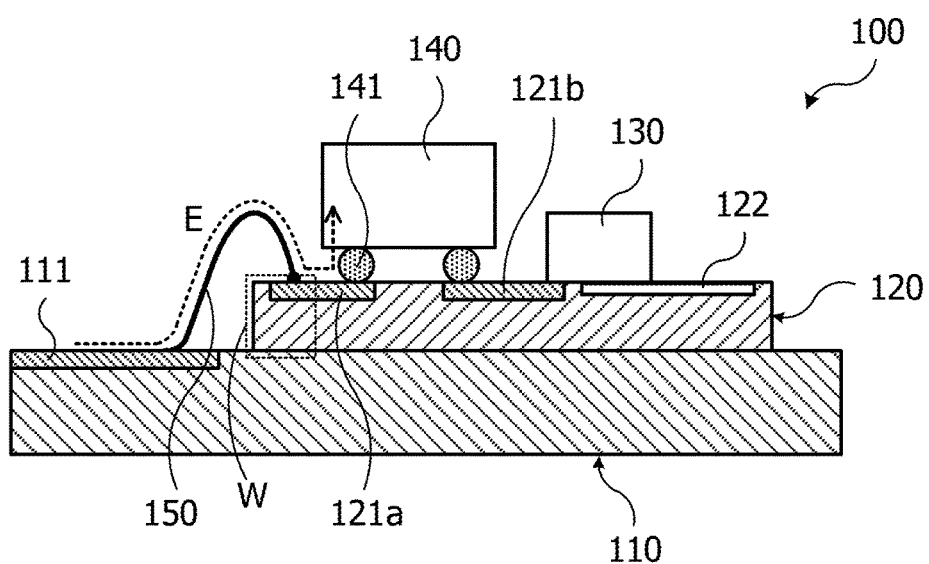

FIGS. 2A and 2B are explanatory views of an electrical signal path of the optical module. FIG. 2A illustrates a schematic top plan view of a main part of the optical module, and FIG. 2B illustrates a schematic cross-sectional view taken along line L2-L2 in FIG. 2A. In addition, FIGS. 2A and 2B schematically illustrate supply paths of electrical signals by dotted lines.

As illustrated in FIGS. 2A and 2B, in the optical module 100, electrical signals E, which are transmitted to the control chip 140 for controlling an operation of the semiconductor laser 130, are supplied through the conductor layers 111 of the board 110, the wires 150, and the conductor layers 121a of the silicon photonics chip 120.

As described above, in the case of the structure in which the electrical signals E supplied from the conductor layer 111 of the board 110 to the control chip 140 pass through the wire 150 and the conductor layer 121a of the silicon photonics chip 120, a wiring length to the control chip 140 (a supply path length of the electrical signals E) is comparatively increased. In the case in which the wiring length from the board 110 to the control chip 140 is increased, the supply of the electrical signal E to the control chip 140 is delayed, and as a result, there is a likelihood that the operation of the control chip 140 will be delayed. As a result, the operation of the semiconductor laser 130 is delayed such that there is a possibility that a high-speed operation of the optical module 100 may not be achieved.

In this structure, the conductor layers 121a, for example, bonding pads 121aa illustrated in FIG. 2A, which may be connected to the conductor layers 111 of the board 110 through the wires 150, are provided on the silicon photonics chip 120. Because arrangement regions W for the conductor layers 121a are required on the silicon photonics chip 120, a size of the silicon photonics chip 120 is increased to that extent. Further, the material costs and manufacturing costs of the silicon photonics chip 120 are likely to be increased.

In consideration of the aforementioned situations, an optical module is implemented by adopting configurations described herein through the following embodiments. First, a first embodiment will be described.

Figure 3A:
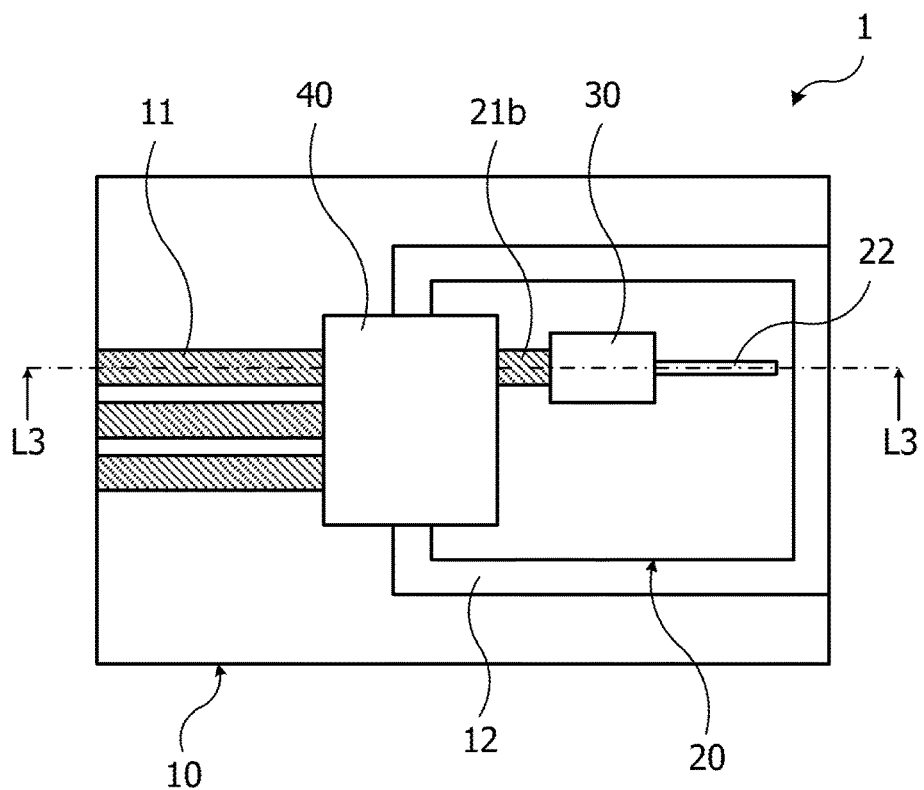
FIGS. 3A and 3B are views illustrating an example of an optical module according to a first embodiment.
Figure 3B:
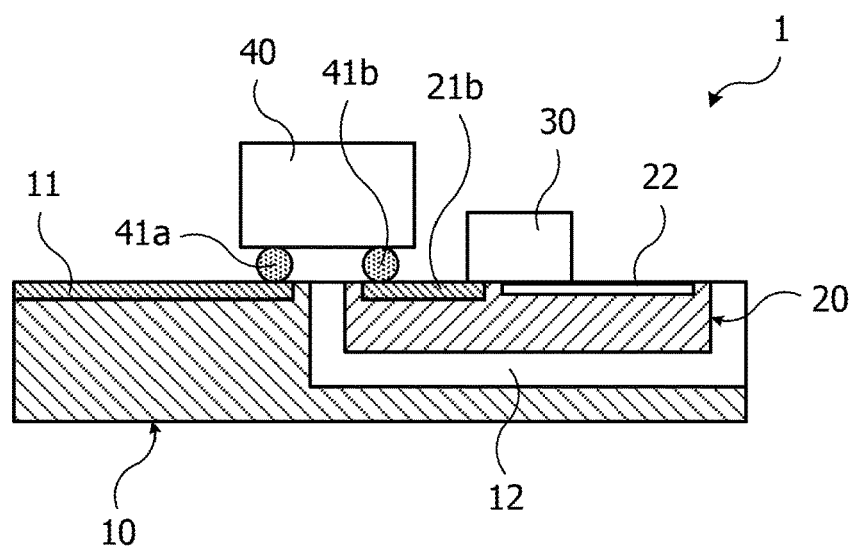

FIGS. 3A and 3B are views illustrating an example of an optical module according to the first embodiment. FIG. 3A illustrates a schematic top plan view of a main part of the optical module, and FIG. 3B illustrates a schematic cross-sectional view taken along line L3-L3 in FIG. 3A.

An optical module 1 illustrated in FIGS. 3A and 3B includes a board 10, a silicon photonics chip 20, a semiconductor laser 30, and a control chip 40. Various types of circuit boards such as a printed board, a package board, an interposer, and a motherboard are used as the board 10. As electric wiring, conductor layers 11 having predetermined patterns are provided on the board 10. The conductor layer 11 is formed by using various types of conductive materials such as copper. A recessed portion 12, which is sized to be able to accommodate the silicon photonics chip 20, is formed in the board 10. Here, as an example, the recessed portion 12, which has a planar rectangular shape and extends from the vicinity of the center of the board 10 to one end of the board 10, is illustrated.

The silicon photonics chip 20 is accommodated in the recessed portion 12 of the board 10. The silicon photonics chip 20 is formed using a silicon substrate or an SOI substrate. As electric wiring, a conductor layer 21b having a predetermined pattern is provided on the silicon photonics chip 20, and as optical wiring, an optical waveguide 22 having a predetermined pattern is provided on the silicon photonics chip 20. The conductor layer 21b is formed using various types of conductive materials such as copper. For example, the optical waveguide 22 is formed using silicon for a core, and silicon oxide for a clad The semiconductor laser 30 is provided on the silicon photonics chip 20. For example, the semiconductor laser 30 is formed using various types of compound semiconductor materials such as a gallium arsenide based material, an indium phosphide based material, and a gallium nitride based material. Here, a surface emitting laser such as a VCSEL is exemplified as the semiconductor laser 30.

The semiconductor laser 30 is electrically connected to the conductor layer 21b of the silicon photonics chip 20. Light is emitted from the semiconductor laser 30 using electrical signals supplied to the semiconductor laser 30 through the conductor layer 21b. The semiconductor laser 30 is optically connected to the optical waveguide 22 of the silicon photonics chip 20 in a state in which optical axes of the semiconductor laser 30 and the optical waveguide 22 coincide with each other, and the emitted light is coupled to the optical waveguide 22.

Various types of semiconductor elements such as the LSI are used for the control chip 40. The control chip 40 is mounted across the board 10 and the silicon photonics chip 20. The control chip 40 is electrically connected to the conductor layer 11 of the board 10 by terminal joint portions 41a such as solder bumps or pillar electrodes, and electrically connected to the conductor layer 21b of the silicon photonics chip 20 by terminal joint portions 41b such as solder bumps or pillar electrodes (flip chip bonding). In addition, here, as an example, the terminal joint portions 41a and 41b configured as solder bumps are schematically illustrated.

The materials, the shapes, the sizes, and the like of the terminal joint portions 41a and 41b may be the same as or different from each other. For example, the types of terminal joint portions 41a and 41b are selected based on a material, a size, and the like of a terminal (electrode pad) of the control chip 40 and based on materials, sizes, pitches, and the like of the conductor layer 11 of the board 10 and the conductor layer 21b of the silicon photonics chip 20.

The control chip 40 is operated by an electrical signal supplied from the board 10 through the conductor layer 11 and the terminal joint portion 41a. The electrical signal output from the control chip 40 is supplied to the semiconductor laser 30 through the terminal joint portion 41b and the conductor layer 21b of the silicon photonics chip 20. The control chip 40 controls the electrical signal to be supplied to the semiconductor laser 30 through the conductor layer 21b, and controls an ON/OFF operation of the light of the semiconductor laser 30.

The light, which is controlled by the control chip 40 and emitted from the semiconductor laser 30, is transmitted to the optical waveguide 22 of the silicon photonics chip 20, and for example, the light is transmitted to another optical element such as an optical fiber optically connected to the optical waveguide 22.

In the optical module 1 illustrated in FIGS. 3A and 3B, the silicon photonics chip 20 is accommodated in the recessed portion 12 of the board 10, and the control chip 40 is mounted across the board 10 and the silicon photonics chip 20. The control chip 40 is bonded to the conductor layer 11 of the board 10 and the conductor layer 21b of the silicon photonics chip 20. The optical module 1 has a bridge structure in which the board 10 and the silicon photonics chip 20 are bridged through the control chip 40. In the optical module 1 having the bridge structure, a wiring length for supplying the electrical signal to the control chip 40 may be shortened in comparison with the optical module 100 (FIGS. 1A and 1B and FIGS. 2A and 2B) using the wire bonding. In this respect, descriptions will be made with reference to FIGS. 4A and 4B and FIGS. 5A and 5B.

Figure 4A:
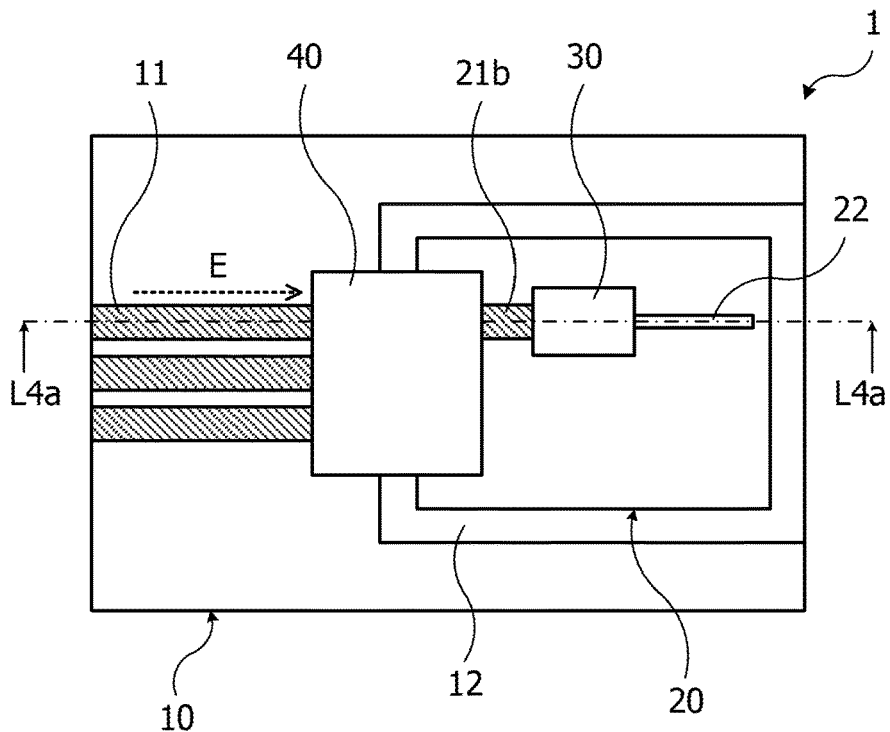
FIGS. 4A and 4B are explanatory views (part 1) of a wiring length of the optical module according to the first embodiment.
Figure 4B:
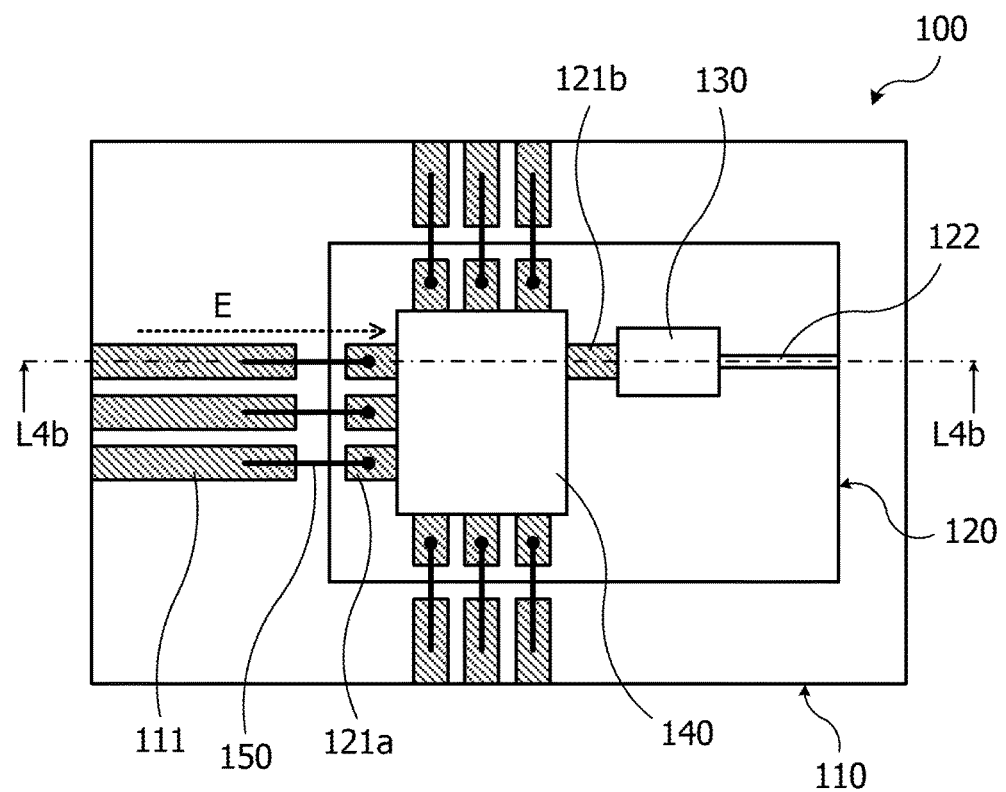
Figure 5A:
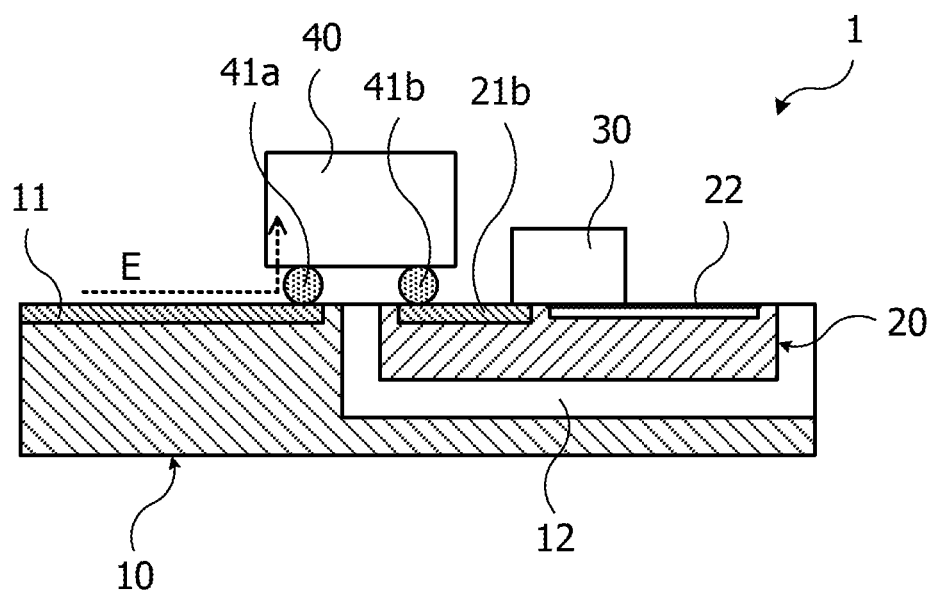
FIGS. 5A and 5B are explanatory views (part 2) of the wiring length of the optical module according to the first embodiment.
Figure 5B:
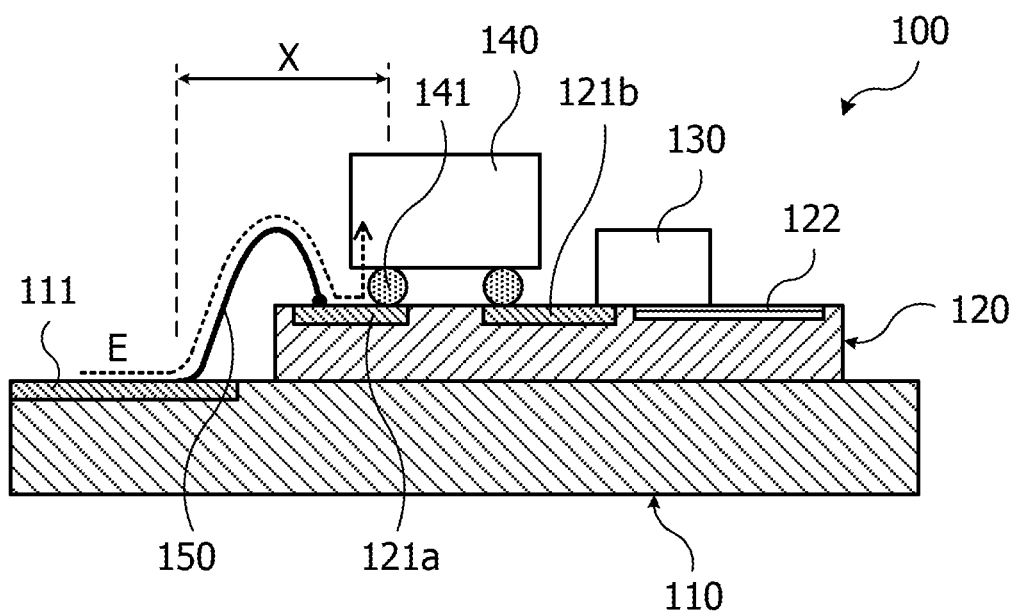

FIGS. 4A and 4B and FIGS. 5A and 5B are explanatory views of a wiring length of the optical module according to the first embodiment. FIG. 4A illustrates a schematic top plan view of a main part of the optical module, and FIG. 4B illustrates a schematic top plan view of the main part of the optical module using wire bonding for comparison. FIG. 5A illustrates a schematic cross-sectional view taken along line L4a-L4a in FIG. 4A, and FIG. 5B illustrates a schematic cross-sectional view taken along line L4b-L4b in FIG. 4B for comparison. In addition, FIGS. 4A and 5A and FIGS. 4B and 5B schematically illustrate supply paths of electrical signals by dotted lines.

In the optical module 1 illustrated in FIGS. 4A and 5A, the control chip 40 is bonded to the conductor layers 11 of the board 10 through the terminal joint portions 41a. Meanwhile, in the optical module 100 illustrated in FIGS. 4B and 5B, the control chip 140 is bonded, through the terminal joint portions 141, to the conductor layers 121a of the silicon photonics chip 120 connected to the conductor layers 111 of the board 110 through the wires 150. Therefore, in the optical module 1, the wiring length from the conductor layer 11 of the board 10 to the control chip 40 (the supply path length of the electrical signal E) is shortened by the length of a range X (FIG. 5B) including the wires 150 and the conductor layers 121a of the silicon photonics chip 120 in the optical module 100.

As described above, the wiring length is shortened in the optical module 1 illustrated in FIGS. 4A and 5A in comparison with the optical module 100 illustrated in FIGS. 4B and 5B, and as a result, a delay of the electrical signal E to be supplied to the control chip 40 from the board 10 is inhibited. Therefore, a delay of an operation of the semiconductor laser 30 controlled by the control chip 40 is inhibited, and as a result, the optical module 1 capable of operating at a high speed is implemented.

In addition, the optical module 1 illustrated in FIGS. 4A and 5A does not require the arrangement region for the conductor layer 121a (bonding pad 121aa and the like) for connecting the wires 150 provided in the optical module 100 illustrated in FIGS. 4B and 5B. For this reason, in the optical module 1, the size of the silicon photonics chip 20 may be reduced by the arrangement region that becomes unnecessary. Therefore, the miniaturization of the silicon photonics chip 20 is implemented, and as a result, material costs and manufacturing costs are reduced according to the miniaturization. Furthermore, the miniaturization and the reduction in costs of the optical module 1 are achieved by the miniaturization of the silicon photonics chip 20 which is obtained by the elimination of the wires 150.

Figure 6A:
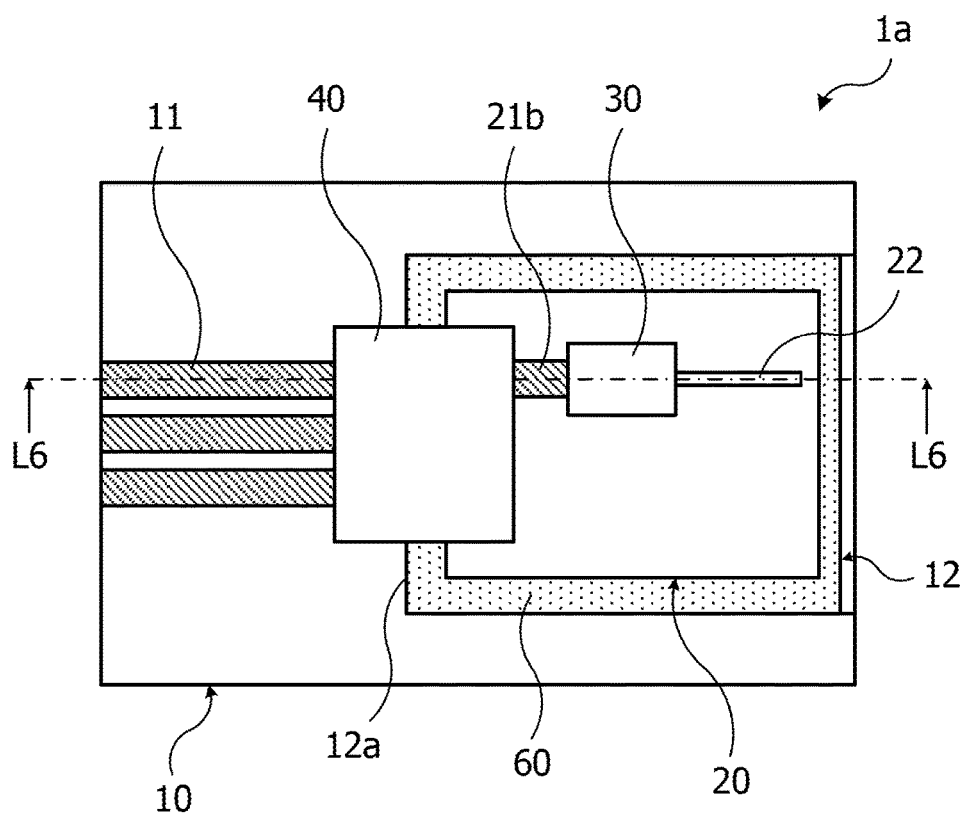
FIGS. 6A and 6B are views illustrating a first configuration example of the optical module according to the first embodiment.
Figure 6B:
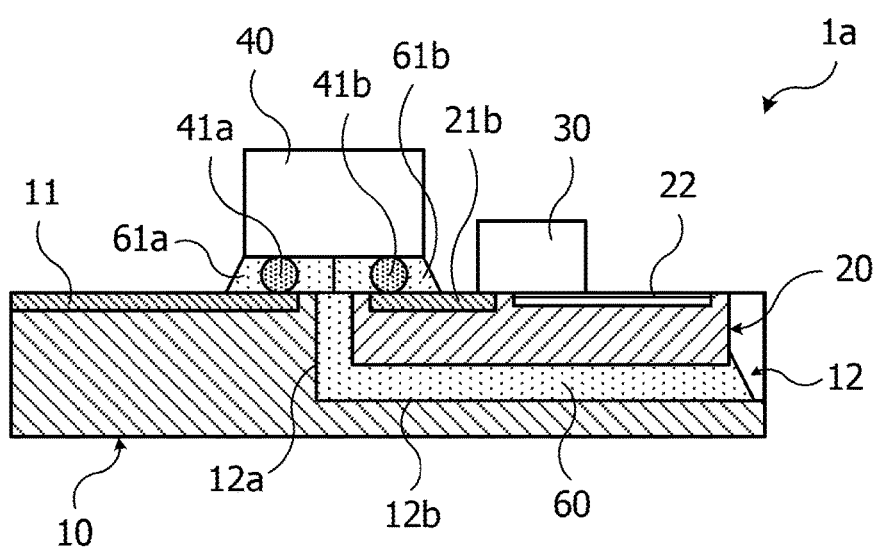

Hereinafter, examples of the optical module including the aforementioned configurations will be further described. First, a first configuration example will be described. FIGS. 6A and 6B are views illustrating the first configuration example of the optical module according to the first embodiment. FIG. 6A illustrates a schematic top plan view of a main part of the optical module, and FIG. 6B illustrates a schematic cross-sectional view taken along line L6-L6 in FIG. 6A.

In an optical module 1a illustrated in FIGS. 6A and 6B, a bonding material 60 is provided between a sidewall 12a and a bottom surface 12b of the recessed portion 12 of the board 10 and the silicon photonics chip 20 accommodated in the recessed portion 12. The board 10 and the silicon photonics chip 20 are bonded together by the bonding material 60. Various types of resin materials such as a thermosetting resin, a thermoplastic resin, and a photocurable resin are used as the bonding material 60.

In the optical module 1a, underfill materials 61a and 61b (bonding materials) are provided between the board 10 and the control chip 40 bonded together by the terminal joint portion 41a and between the silicon photonics chip 20 and the control chip 40 bonded together by the terminal joint portion 41b, respectively. Various types of resin materials such as a thermosetting resin, a thermoplastic resin, and a photocurable resin are used as the underfill materials 61a and 61b. The underfill materials 61a and 61b may be the same material, or may be different materials. For example, the same material is used for the underfill materials 61a and 61b.

For example, a thermosetting resin such as epoxy resin, phenol resin, and polyimide resin, a thermoplastic resin such as polyethylene-terephthalate resin, acrylic resin, and polyamide resin, an epoxy based or acrylate based ultraviolet curable resin, or the like are used as the bonding material 60, the underfill material 61a, and the underfill material 61b.

The bonding material 60 and the underfill materials 61a and 61b may be the same material, or may be different materials. In the optical module 1a, the board 10 and the silicon photonics chip 20 are bonded together by the bonding material 60 interposed between the board 10 and the silicon photonics chip 20, and as a result, bonding strength between the board 10 and the silicon photonics chip 20 is improved. Furthermore, since the control chip 40, the board 10, and the silicon photonics chip 20 are bonded together by the underfill materials 61a and 61b, bonding strength between the control chip 40 and the board 10 and the silicon photonics chip 20 is improved. Therefore, the optical module 1a having excellent bonding strength between the components is implemented.

For example, in the case of a configuration in which the bonding material 60, the underfill material 61a, and the underfill material 61b are not provided, the silicon photonics chip 20 accommodated in the recessed portion 12 of the board 10 is supported by the control chip 40. That is, the silicon photonics chip 20 is supported by the control chip 40 which is bonded to the silicon photonics chip 20 by the terminal joint portion 41b and bonded to the board 10 by the terminal joint portion 41a. In this case, when external force is applied to the silicon photonics chip 20, stresses easily concentrate on the terminal joint portions 41b and 41a of the control chip 40 that supports the silicon photonics chip 20. In addition, even when the board 10 is thermally expanded, stresses easily concentrate on the terminal joint portions 41b and 41a of the control chip 40. The stress concentration on the terminal joint portions 41b and 41a results in a fracture of the terminal joint portions 41b and 41a, which is likely to cause deterioration in performance and reliability of the optical module 1a.

In contrast, in the optical module 1a, when external force is applied, displacement or deformation of the silicon photonics chip 20 is inhibited by the bonding material 60 provided between the board 10 and the silicon photonics chip 20. Therefore, it is possible to inhibit the stresses of the terminal joint portions 41b and 41a which may be caused by external force applied to the silicon photonics chip 20. Furthermore, in the optical module 1a, bonding strength obtained by the terminal joint portions 41b and 41a is reinforced by the underfill materials 61b and 61a provided between the control chip 40 and the silicon photonics chip 20 and the board 10. Therefore, even in a case in which stresses are applied to the terminal joint portions 41b and 41a, it is possible to inhibit the terminal joint portions 41b and 41a from being fractured.

In the optical module 1a illustrated in FIGS. 6A and 6B, similar to the optical module 1 (FIGS. 3A and 3B to FIGS. 5A and 5B), a reduction in wiring length is achieved by the bridge structure of the control chip 40, and a high-speed operation, miniaturization, and a reduction in costs are achieved by the reduction in wiring length. Furthermore, according to the optical module 1a, high strength is achieved by the bonding material 60, and the fracture of the terminal joint portions 41b and 41a is inhibited by the high strength, and as a result, deterioration in performance and reliability of the optical module 1a is inhibited.

From the point of view of achieving the high strength of the optical module 1a, the bonding materials 60 may be provided at both of a portion between the bottom surface 12b of the recessed portion 12 of the board 10 and the silicon photonics chip 20 and a portion between the sidewall 12a of the recessed portion 12 and the silicon photonics chip 20. In the case in which the bonding materials 60 are provided at both of the portions, the bonding strength of the silicon photonics chip 20 with respect to the board 10 is increased, and the silicon photonics chip 20 may be structured to be strong against external force, in comparison with the case in which the bonding material 60 is provided at any one of the portions.

From the point of view of achieving the high strength of the optical module 1a, the bonding material 60, the underfill material 61a, and the underfill material 61b may be bonded to each other to be integrated. Since the bonding material 60 and the underfill materials 61a and 61b are bonded to each other, that is, different materials are bonded to each other, the bonding strength may be increased between the board 10 and the silicon photonics chip 20, and the control chip 40, in comparison with the case in which the bonding material 60 and the underfill materials 61a and 61b are not bonded to each other.

Figure 7:
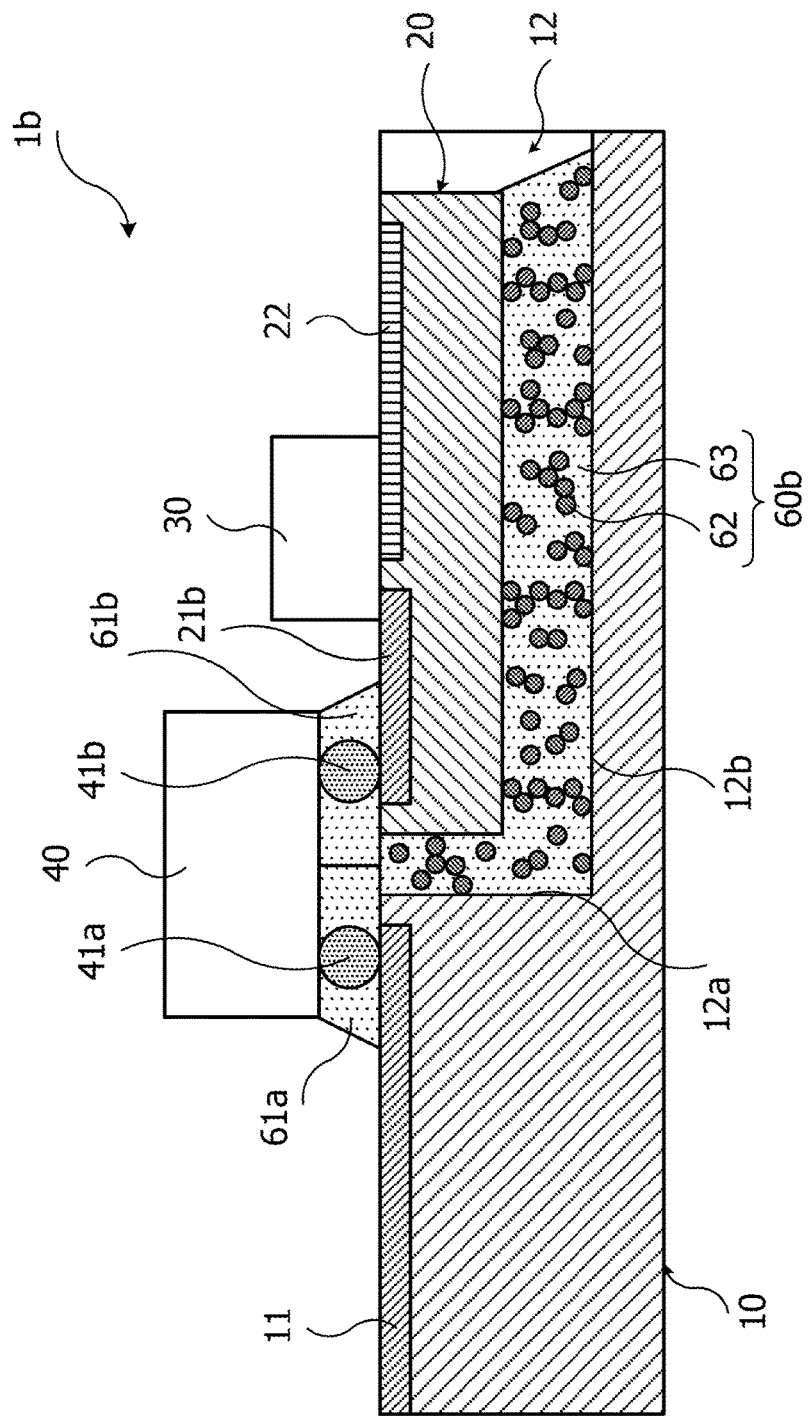
FIG. 7 is a view illustrating a second configuration example of the optical module according to the first embodiment.

Next, a second configuration example will be described. FIG. 7 is a view illustrating the second configuration example of the optical module according to the first embodiment. FIG. 7 illustrates a schematic cross-sectional view of a main part of the optical module.

In an optical module 1b illustrated in FIG. 7, a resin 63 containing thermally conductive fillers 62 is used for a bonding material 60b provided between the board 10 and the silicon photonics chip 20 accommodated in the recessed portion 12 of the board 10.

Various types of resin materials such as a thermosetting resin, a thermoplastic resin, and a photocurable resin are used for the resin 63 of the bonding material 60b. A material, which has higher thermal conductivity than the material used for the resin 63, is used for the fillers 62 of the bonding material 60b. For example, various types of metallic materials such as copper (Cu), aluminum (Al), silver (Ag), and gold (Au), various types of ceramics materials such as aluminum nitride (AlN), and aluminum oxide ($Al_2O_3$), and various types of carbon materials such as carbon nanotube and graphene are used for the fillers 62. One type of material or two or more types of materials are included in the fillers 62. For example, powder including particles made of one type or two or more types of materials, or powder including particles of which the surfaces are coated with one type or two or more types of materials is used for the fillers 62.

When the optical module 1b operates, heat is generated from the semiconductor laser 30 and the control chip 40. For example, the heat (a part of the heat) generated from the semiconductor laser 30 and the control chip 40 is transferred to the board 10 and the silicon photonics chip 20 on which the semiconductor laser 30 and the control chip 40 are mounted.

Here, in the optical module 1b, the resin 63 containing the thermally conductive fillers 62 is used for the bonding material 60b for bonding the silicon photonics chip 20 to the board 10. For this reason, in comparison with the case in which a used bonding material does not contain the fillers 62, the heat transferred from the semiconductor laser 30 and the control chip 40 to the silicon photonics chip 20 is more effectively transferred to the board 10 through the bonding material 60b containing the fillers 62. Therefore, heat dissipation (cooling speed) for the semiconductor laser 30 and the control chip 40 is improved, and as a result, the overheat of the semiconductor laser 30 and the control chip 40, and the performance deterioration and damage of the semiconductor laser 30 and the control chip 40 caused due to the overheat may be inhibited.

According to the optical module 1b illustrated in FIG. 7, similar to the optical module 1, a reduction in wiring length is achieved by the bridge structure of the control chip 40, and a high-speed operation, miniaturization, and a reduction in costs are achieved by the reduction in wiring length. Furthermore, according to the optical module 1b, heat dissipation for the semiconductor laser 30 and the control chip 40 is improved in addition to achieving the high strength of the bonding material 60b and inhibiting the fracture of the terminal joint portions 41b and 41a by the high strength.

Figure 8:
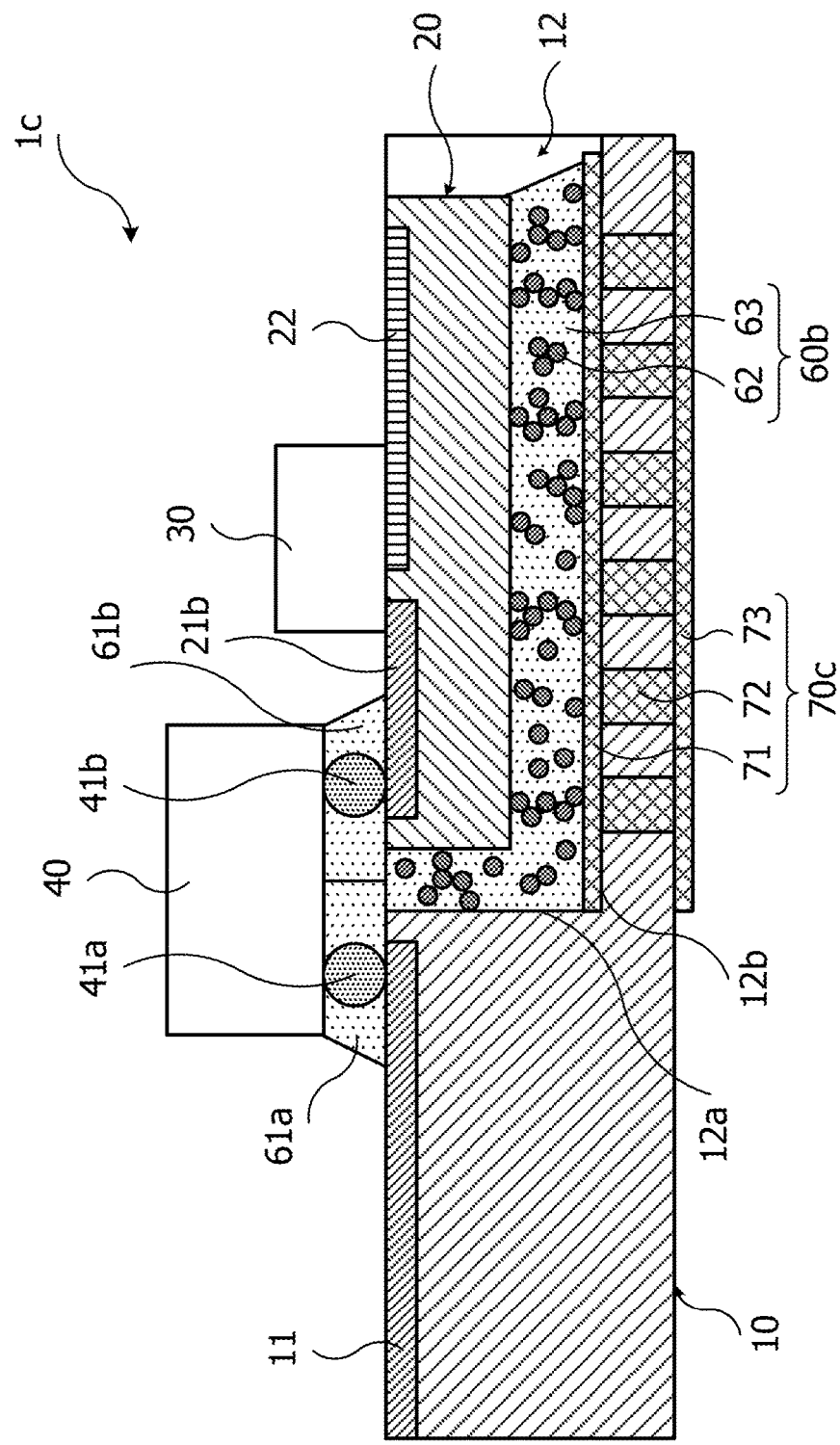
FIG. 8 is a view illustrating a third configuration example of the optical module according to the first embodiment.

Next, a third configuration example will be described. FIG. 8 is a view illustrating the third configuration example of the optical module according to the first embodiment. FIG. 8 illustrates a schematic cross-sectional view of a main part of the optical module.

An optical module 1c illustrated in FIG. 8 has a heat conduction layer 71 which is provided on the bottom surface 12b of the recessed portion 12 of the board 10, heat conduction via holes 72 which are connected to the heat conduction layer 71 and penetrate the board 10, and a heat conduction layer 73 which is connected to the heat conduction via holes 72 and provided on a bottom surface of the board 10. From this point of view, the optical module 1c differs from the optical module 1b (FIG. 7).

A material, which has higher thermal conductivity than a material (organic based or inorganic based insulating material) used for an insulating portion of the board 10, is used for the heat conduction layer 71, the heat conduction via holes 72, and the heat conduction layer 73. For example, various types of metallic materials such as copper, aluminum, silver, and gold are used for the heat conduction layer 71, the heat conduction via holes 72, and the heat conduction layer 73. In addition to the aforementioned materials, various types of ceramics materials such as aluminum nitride and aluminum oxide and various types of carbon materials such as carbon nanotube and graphene may be used for the heat conduction layer 71, the heat conduction via holes 72, and the heat conduction layer 73.

A heat conduction path 70c, which passes through the board 10 from the recessed portion 12 of the board 10 to an outer surface of the board 10, is formed in the optical module 1c by the heat conduction layer 71, the heat conduction via holes 72, and the heat conduction layer 73. In the optical module 1c, heat, which is first generated from the semiconductor laser 30 and the control chip 40 and then transferred to the silicon photonics chip 20, is transferred to the bonding material 60b containing the thermally conductive fillers 62. Further, the heat is dissipated to the outside of the board 10 through the heat conduction path 70c of the board 10 connected to the bonding material 60b, that is, through the heat conduction layer 71, the heat conduction via holes 72, and the heat conduction layer 73. Therefore, heat dissipation for the semiconductor laser 30 and the control chip 40 is improved, and as a result, the overheat of the semiconductor laser 30 and the control chip 40 and the performance deterioration and damage of the semiconductor laser 30 and the control chip 40, which may be caused due to the overheat, are inhibited.

According to the optical module 1c illustrated in FIG. 8, similar to the optical module 1, a reduction in wiring length is achieved by the bridge structure of the control chip 40, and a high-speed operation, miniaturization, and a reduction in costs are achieved by the reduction in wiring length. Furthermore, according to the optical module 1c, heat dissipation for the semiconductor laser 30 and the control chip 40 is improved in addition to achieving high strength of the bonding material 60b and inhibiting the fracture of the terminal joint portions 41b and 41a by the high strength.

Figure 9:
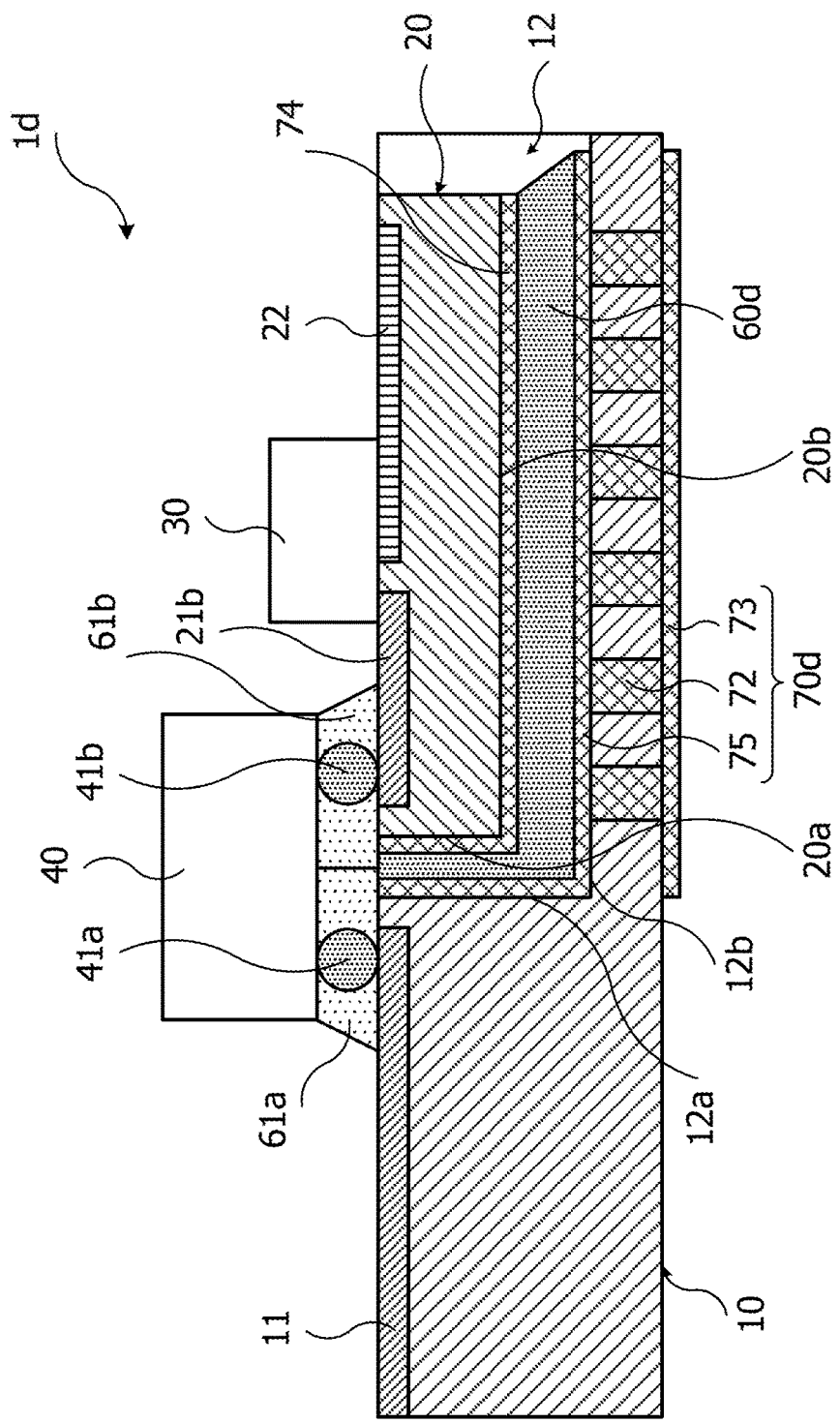
FIG. 9 is a view illustrating a fourth configuration example of the optical module according to the first embodiment.

Next, a fourth configuration example will be described. FIG. 9 is a view illustrating the fourth configuration example of the optical module according to the first embodiment. FIG. 9 illustrates a schematic cross-sectional view of a main part of the optical module.

In an optical module 1d illustrated in FIG. 9, a heat conduction layer 74 made of a metal or the like which is wet by molten solder is provided on a lateral surface 20a and a bottom surface 20b of the silicon photonics chip 20 which face the sidewall 12a and the bottom surface 12b of the recessed portion 12 of the board 10, respectively. The board 10 has a heat conduction path 70d including a heat conduction layer 75 which is provided on the sidewall 12a and the bottom surface 12b of the recessed portion 12, heat conduction via holes 72 which are connected to the heat conduction layer 75 and penetrate the board 10, and a heat conduction layer 73 which is connected to the heat conduction via holes 72 and provided on the bottom surface of the board 10. A material such as a metal or the like which is wet by the molten solder is used for the heat conduction layer 75.

In the optical module 1d, solder is used for a bonding material 60d provided between the board 10 and the silicon photonics chip 20. Various types of solder materials containing tin (Sn), such as, for example, a tin solder, a tin-silver based solder, a tin-copper based solder, a tin-indium (In) based solder, and a tin-bismuth (Bi) based solder are used for the solder for the bonding material 60d.

To form the optical module 1d, a solder or solder paste is provided between the board 10 and the silicon photonics chip 20 which are bridged by the control chip 40, and the solder is molten by being heated and solidified by being cooled. In this case, the solder, which is molten by being heated, is spread over the heat conduction layer 75 provided on the board 10 and the heat conduction layer 74 provided on the silicon photonics chip 20, and thereafter, the solder is solidified by being cooled. Therefore, the board 10 and the silicon photonics chip 20 may be bonded using the bonding material 60d of the solder.

In the optical module 1d, heat, which is generated from the semiconductor laser 30 and the control chip 40 and transferred to the silicon photonics chip 20, is transferred to the heat conduction layer 74, the bonding material 60d of the solder, and the heat conduction layer 75, and the heat is dissipated to the outside of the board 10 through the heat conduction path 70d. Since the solder having high thermal conductivity is used for the bonding material 60d, the heat is effectively transferred from the heat conduction layer 74 on the silicon photonics chip 20 to the heat conduction path 70d in the board 10. Therefore, heat dissipation for the semiconductor laser 30 and the control chip 40 is improved, and as a result, the overheat of the semiconductor laser 30 and the control chip 40 and the performance deterioration and damage of the semiconductor 30 and the control chip 40, which may be caused due to the overheat, are inhibited.

According to the optical module 1d illustrated in FIG. 9, similar to the optical module 1, a reduction in wiring length is achieved by the bridge structure of the control chip 40, and a high-speed operation, miniaturization, and a reduction in costs are achieved by the reduction in wiring length. Furthermore, according to the optical module 1d, heat dissipation for the semiconductor laser 30 and the control chip 40 is improved in addition to achieving high strength of the bonding material 60d and inhibiting the fracture of the terminal joint portions 41b and 41a.

Figure 10:
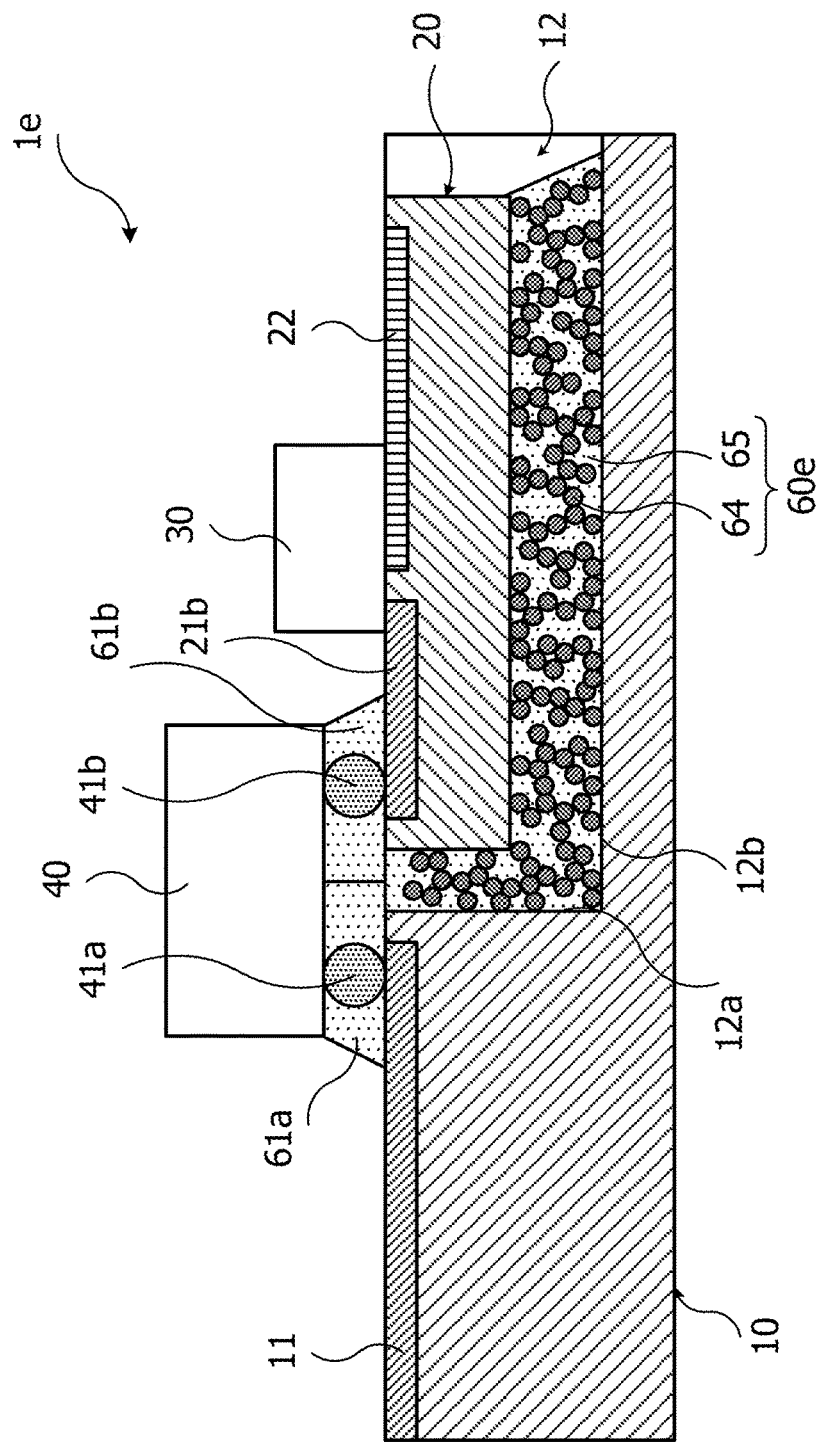
FIG. 10 is a view illustrating a fifth configuration example of the optical module according to the first embodiment.

Next, a fifth configuration example will be described. FIG. 10 is a view illustrating the fifth configuration example of the optical module according to the first embodiment. FIG. 10 illustrates a schematic cross-sectional view of a main part of the optical module.

In the optical module 1e illustrated in FIG. 10, a material having comparatively small curing shrinkage is used for a bonding material 60e provided between the board 10 and the silicon photonics chip 20 accommodated in the recessed portion 12 of the board 10. For example, a resin 65 containing fillers 64 is used for the bonding material 60e. In this case, various types of resin materials such as a thermosetting resin, a thermoplastic resin, and a photocurable resin are used as the resin 65. Various types of insulating or conductive materials are used for the fillers 64. The content of fillers 64 is comparatively large, for example, about 80% by weight to about 90% by weight.

To form the optical module 1e, the resin 65 containing the fillers 64 and having fluidity is provided between the board 10 and the silicon photonics chip 20 which are bridged by the control chip 40, and the resin 65 is cured using heat or light such as an ultraviolet ray. Therefore, the board 10 and the silicon photonics chip 20 may be bonded using the bonding material 60e including the fillers 64.

In general, the resin is shrunk (curing shrinkage) when the resin is cured. For this reason, in the case in which, for example, a resin containing no filler is used to bond the board 10 and the silicon photonics chip 20 which are bridged by the control chip 40, the terminal joint portions 41b and 41a are likely to be fractured by stresses generated by the curing shrinkage of the resin.

Therefore, because the amount of resin 65 in the bonding material 60e is reduced when the resin 65 containing the fillers 64 like the bonding material 60e of the optical module 1e is used, the curing shrinkage of the resin is reduced when the resin is provided and cured between the board 10 and the silicon photonics chip 20. As described above, a bonding function is ensured by including the resin 65, and the curing shrinkage of the bonding material 60e is inhibited by reducing the amount of the resin 65 by using the fillers 64. Since the curing shrinkage of the bonding material 60e is inhibited, the stresses are inhibited from being generated on the terminal joint portions 41b and 41a, and the fracture of the terminal joint portions 41b and 41a caused by the stresses is inhibited.

In the bonding material 60e, the influence of the curing shrinkage of the resin 65 is inhibited as the content of fillers 64 is increased. Since the resin 65 containing the comparatively large amount of fillers 64 is used for the bonding material 60e, the fracture of the terminal joint portions 41b and 41a caused by the curing shrinkage is effectively inhibited.

Because the amount of remaining resin 65 is reduced as the content of fillers 64 is increased, the content of fillers 64 may be set in consideration of the bonding function exhibited by the remaining resin 65 when setting the content of fillers 64. In addition, because the content of fillers 64 affects the viscosity of the bonding material 60e, the content of fillers 64 may be set in consideration of handling of the bonding material 60e when forming the optical module 1e, a size of a gap where the bonding material 60e is provided, and the like.

According to the optical module 1e illustrated in FIG. 10, similar to the optical module 1, a reduction in wiring length is achieved by the bridge structure of the control chip 40, and a high-speed operation, miniaturization, and a reduction in costs are achieved by the reduction in wiring length. Furthermore, according to the optical module 1e, high strength is achieved by the bonding material 60e, and the fracture of the terminal joint portions 41b and 41a is inhibited by the high strength.

Similar to the aforementioned bonding material 60e described in the fifth configuration example, the amount of thermally conductive fillers 62 contained in the resin 63 of the bonding material 60b described in the second and third configuration examples may be increased. As the amount of thermally conductive fillers 62 is increased, the curing shrinkage of the bonding material 60b and the fracture of the terminal joint portions 41b and 41a caused by the curing shrinkage of the bonding material 60b may be effectively inhibited. Furthermore, the fillers 62 more easily come into contact with one another as the amount of thermally conductive fillers 62 is increased, and as a result, a heat conduction path is easily formed in the bonding material 60b, and for example, a heat conduction path is easily formed from the silicon photonics chip 20 to the board 10 or the heat conduction layer 71. For this reason, heat conduction efficiency from the silicon photonics chip 20 to the board 10 is increased, and as a result, heat dissipation for the semiconductor laser 30 and the control chip 40 may be further improved.

In the fifth configuration example, the example in which the resin 65 containing the fillers 64 is used for the bonding material 60e has been described, but a resin material, which does not contain the fillers 64 and has comparatively small curing shrinkage, may be used. For example, an example of a resin material having comparatively small curing shrinkage may include polyethylene-terephthalate resin, acrylic resin, and the like.

As described above, the first to fifth configuration examples have been described. In addition, in each of the aforementioned optical modules 1a, 1b, 1c, 1d, and 1e, the fillers may be contained in the underfill materials 61a and 61b provided between the control chip 40 and the board 10 and the silicon photonics chip 20. In this case, insulating fillers are used as the fillers in order to avoid the short circuit of the terminal joint portions 41a and 41b.

Next, a method of forming the optical module including the configurations will be described. FIGS. 11A to 11E are views illustrating an example of a method of forming the optical module according to the first embodiment. FIGS. 11A to 11E illustrate schematic cross-sectional views of main parts in the steps of forming the optical module, respectively.

Figure 11A:
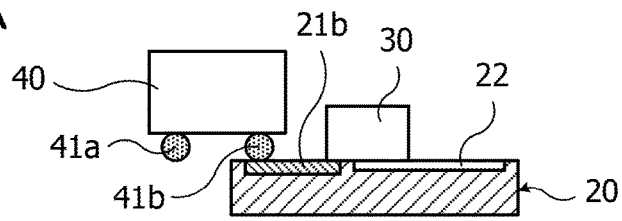
FIGS. 11A to 11E are views illustrating an example of a method of forming the optical module according to the first embodiment.

Here, the method of forming the optical module will be described with reference to the example of the optical module 1*a* illustrated in FIGS. 6A and 6B. As illustrated in FIG. 11A, the semiconductor laser 30 and the control chip 40 are mounted on the silicon photonics chip 20 which is formed with the conductor layer 21*b* and the optical waveguide 22. The optical axis of the semiconductor laser 30 coincides with the optical axis of the optical waveguide 22 of the silicon photonics chip 20, and the semiconductor laser 30 is electrically connected to the conductor layer 21*b* of the silicon photonics chip 20 by a solder. A part of the control chip 40 is bonded to the conductor layer 21*b* of the silicon photonics chip 20 by the terminal joint portion 41*b* such as a solder bump such that the control chip 40 is electrically connected to the conductor layer 21*b*.

Figure 11B:
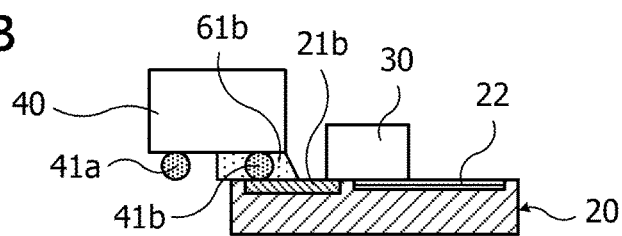

As illustrated in FIG. 11B, the underfill material 61*b* is provided between the control chip 40 and the silicon photonics chip 20 which are bonded to each other by the terminal joint portion 41*b*. For example, a resin having fluidity and turned into the underfill material 61*b* is supplied between the control chip 40 and the silicon photonics chip 20, and the supplied resin is cured by an appropriate method according to the type of the resin.

Figure 11C:
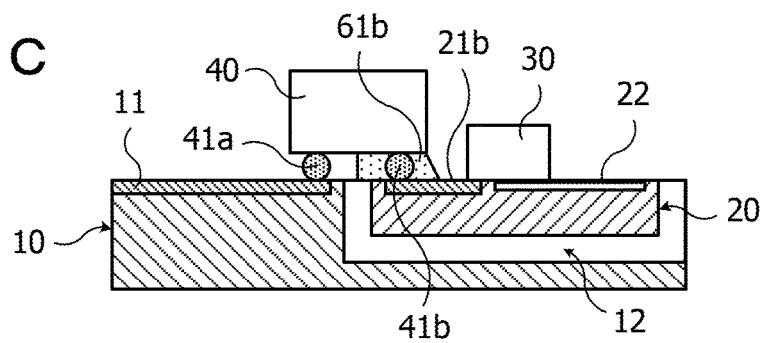

As illustrated in FIG. 11C, the control chip 40 bonded to the silicon photonics chip 20 by the terminal joint portion 41*b* is mounted on the board 10 that is formed with the conductor layer 11 and the recessed portion 12. The silicon photonics chip 20 is accommodated in the recessed portion 12 of the board 10, and a part of the control chip 40 is bonded to the conductor layer 11 of the board 10 by the terminal joint portion 41*a* such as a solder bump such that the control chip 40 is electrically connected to the conductor layer 11.

Figure 11D:
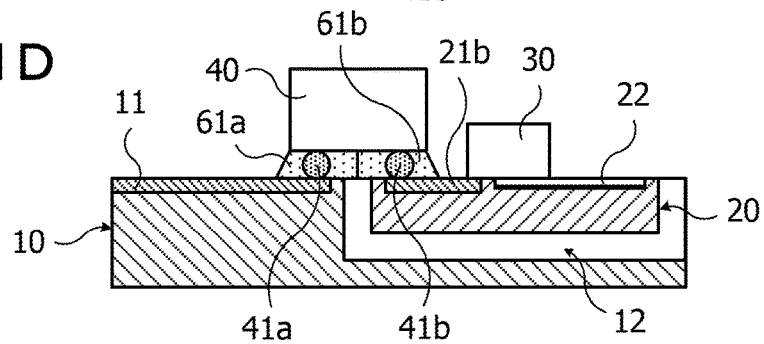

As illustrated in FIG. 11D, the underfill material 61*a* is formed between the control chip 40 and the board 10 which are bonded to each other by the terminal joint portion 41*a*. For example, a resin having fluidity and turned into the underfill material 61*a* is supplied between the control chip 40 and the board 10, and the supplied resin is cured by an appropriate method according to the type of the resin.

Figure 11E:
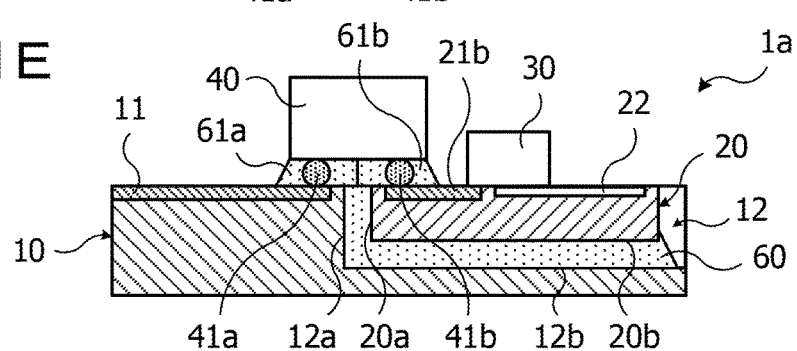

As illustrated in FIG. 11E, the bonding material 60 is provided between the board 10 and the silicon photonics chip 20 which are bridged by the control chip 40. For example, a resin having fluidity and turned into the bonding material 60 is supplied between the board 10 and the silicon photonics chip 20. The resin is supplied between the sidewall 12*a* of the recessed portion 12 of the board 10 and the lateral surface 20*a* of the silicon photonics chip 20 and between the bottom surface 12*b* of the recessed portion 12 of the board 10 and the bottom surface 20*b* of the silicon photonics chip 20. The supplied resin is cured by an appropriate method according to the type of resin.

The optical module 1*a* may be obtained by the steps illustrated in FIGS. 11A to 11E. Here, as illustrated in FIGS. 11B and 11D, the underfill materials 61*a* and 61*b* are formed by separate steps. In addition, the following method may be used.

First, the control chip 40, which is bonded to the silicon photonics chip 20 by the terminal joint portion 41*b* as illustrated in FIG. 11A, is bonded to the board 10 by the terminal joint portion 41*a* according to the example illustrated in FIG. 11C without providing the underfill material 61*b*. Thereafter, the resin is supplied between the control chip 40 and the silicon photonics chip 20 and the board 10, and the resin is cured. As such, the underfill materials 61*a* and 61*b* are integrally formed simultaneously by using the same material. The control chip 40, the board 10, and the silicon photonics chip 20 are bonded by the integrated underfill materials 61*a* and 61*b*, and as a result, the reduction of the number of steps and the improvement of the bonding strength are achieved.

Figure 12A:
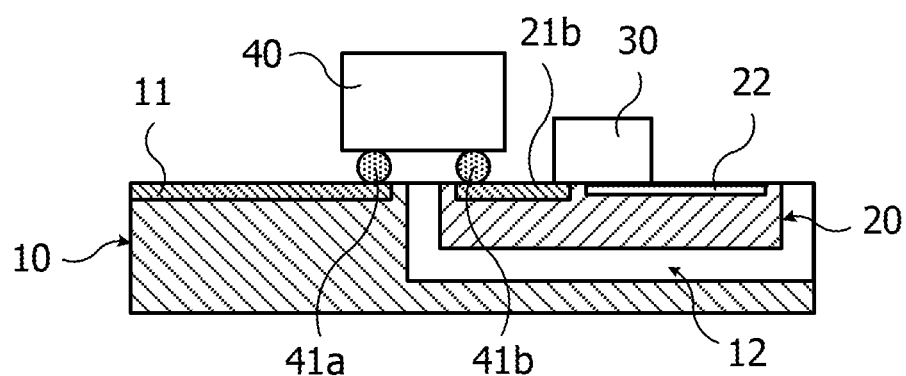
FIGS. 12A and 12B are views illustrating another example of the method of forming the optical module according to the first embodiment.
Figure 12B:
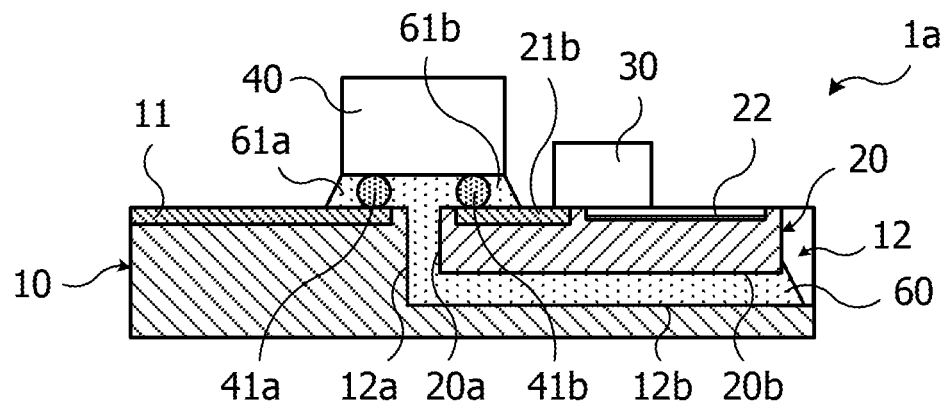

The following method illustrated in FIGS. 12A and 12B may be used. FIGS. 12A and 12B are views illustrating another example of the method of forming the optical module according to the first embodiment. FIGS. 12A and 12B illustrate schematic cross-sectional views of the main parts in the steps of forming the optical module, respectively.

First, the control chip 40, which is bonded to the silicon photonics chip 20 by the terminal joint portion 41*b* as illustrated in FIG. 12A, is bonded to the board 10 by the terminal joint portion 41*a* without providing the underfill material 61*b*. Thereafter, as illustrated in FIG. 12B, a resin having fluidity and turned into the bonding material 60 is supplied between the board 10 and the silicon photonics chip 20. At this time, the resin is additionally supplied between the control chip 40 and the board 10 and the silicon photonics chip 20 as well as between the board 10 and the silicon photonics chip 20. The resin is supplied as described above and then cured, such that the bonding material 60, the underfill material 61*a*, and the underfill material 61*b* are integrally formed simultaneously by using the same material. The board 10, the silicon photonics chip 20, and the control chip 40 are bonded to each other by the integrated bonding material 60 and the integrated underfill materials 61*a* and 61*b*, and as a result, the reduction of number of steps and the improvement of the bonding strength are achieved. The optical module 1*a* may be obtained by using this method.

Here, the example in which the optical module 1*a* illustrated in the FIGS. 6A and 6B is formed has been described, but the optical modules 1*b*, 1*c*, 1*d*, and 1*e* illustrated in FIGS. 7 to 10 may be formed by the same procedure.

For example, in the step in FIG. 11E, the resin 63 (bonding material 60*b*) containing the thermally conductive fillers 62 is used for the material supplied between the board 10 and the silicon photonics chip 20 which are bridged by the control chip 40. In this way, the optical module 1*b* illustrated in the FIG. 7 may be obtained.

In addition, in the step in FIG. 11E, the resin 65 (bonding material 60*e*) containing the insulating or conductive fillers 64 is used for the material supplied between the board 10 and the silicon photonics chip 20 which are bridged by the control chip 40. In this way, the optical module 1*e* illustrated in the FIG. 10 may be obtained.

For example, in the step in FIG. 11C, a board having the heat conduction path 70*c* is used as the board 10 on which the control chip 40 bonded to the silicon photonics chip 20 by the terminal joint portion 41*b* is mounted. Furthermore, in the step in FIG. 11E, the resin 63 (bonding material 60*b*) containing the thermally conductive fillers 62 is used for the material supplied between the board 10 and the silicon photonics chip 20 which are bridged by the control chip 40. In this way, the optical module 1*c* illustrated in the FIG. 8 may be obtained.

For example, the silicon photonics chip 20, which has the heat conduction layer 74 provided on the lateral surface 20*a* and the bottom surface 20*b*, is used in the step in FIG. 11A, and the board 10 having the heat conduction path 70*d* is used in the step in FIG. 11C. Furthermore, in the step in FIG. 11E, the solder (bonding material 60*d*) is used for the material supplied between the board 10 and the silicon photonics chip 20 which are bridged by the control chip 40. In this way, the optical module 1*d* illustrated in the FIG. 9 may be obtained.

To form the optical module 1*d*, the solder, which has a lower melting point than the solder used for the terminal joint portions 41a and 41b of the control chip 40, may be used as the solder supplied between the board 10 and the silicon photonics chip 20. Since the solder having the low melting point is used for the bonding material 60d, it is possible to inhibit the solder for the terminal joint portions 41a and 41b from being molten when melting the solder for the bonding material 60d, and to inhibit the occurrence of a bonding defect or a short-circuit caused by the molten solder.

To form the optical module id, the heat conduction layer 74 may be formed on the lateral surface 20a and the bottom surface 20b of the silicon photonics chip 20 by using a plating method or a sputtering method, or the heat conduction layer 74 may be formed by attaching a plate in the form of the lateral surface 20a and the bottom surface 20b.

Figure 13A:
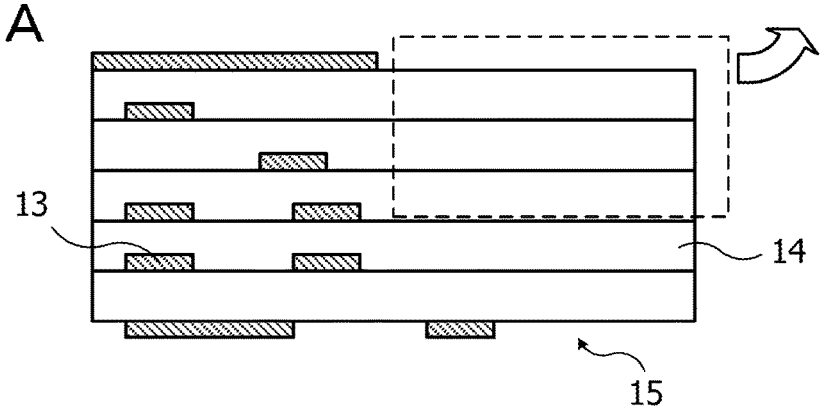
FIGS. 13A to 13C are explanatory views of a method of forming a board according to the first embodiment.
Figure 13B:
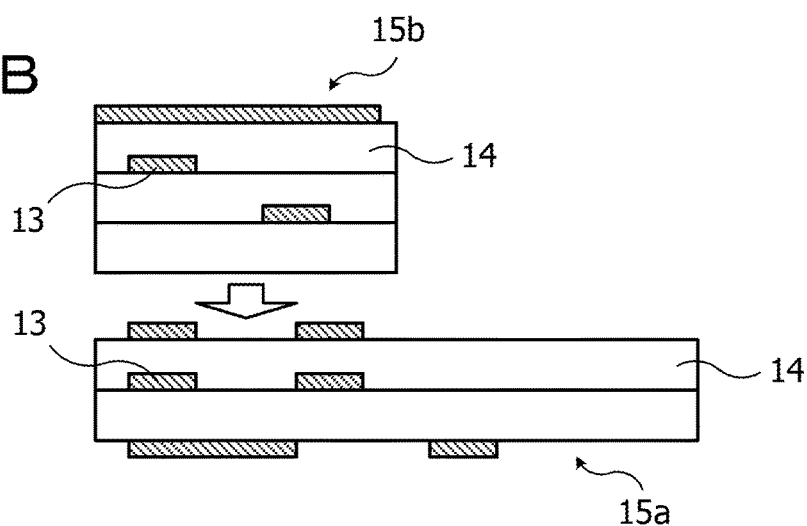
Figure 13C:
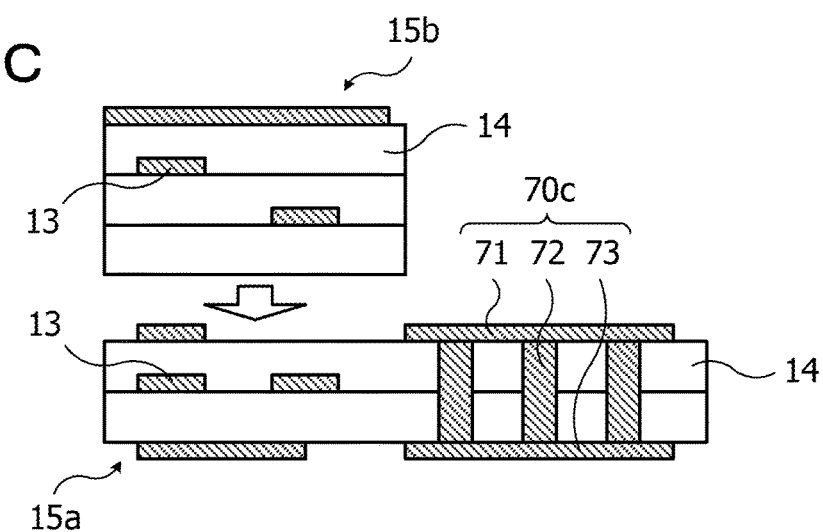

The aforementioned board 10 may be formed as follows. FIGS. 13A to 13C are explanatory views of a method of forming a board according to the first embodiment. FIGS. 13A to 13C illustrate schematic cross-sectional views of main parts in the steps of forming the board, respectively.

As illustrated in FIG. 13A, a build-up board 15 on which a group of insulating layers 14 (a core layer and a build-up layer) each having conductor layers 13 having predetermined patterns are stacked may be used as the board 10.

For example, as illustrated in FIG. 13A, a part of the build-up board 15 (indicated by a dotted line frame in FIG. 13A) is removed by machining using a dicing blade or laser processing. Therefore, the board 10 having the recessed portion 12 for accommodating the silicon photonics chip 20 is formed.

For example, as illustrated in FIG. 13B, a build-up board 15a, which corresponds to a lower portion of the formed board 10 in which the recessed portion 12 is not formed, and a build-up board 15b, which corresponds to an upper portion of the formed board 10 in which the recessed portion 12 is formed, are formed and stacked. The lower build-up board 15a is formed by stacking the group of insulating layers 14 which have a planar rectangular shape and the conductor layers 13 having predetermined patterns. The upper build-up board 15b is formed by stacking the group of insulating layers 14 which have a planar shape and the conductor layers 13 having predetermined patterns. The board 10 having the recessed portion 12 is formed by stacking the build-up boards 15a and 15b.

Here, as illustrated in FIG. 13C, the heat conduction layer 71, the heat conduction via holes 72, and the heat conduction layer 73, which constitute the heat conduction path 70c for thermally connecting front and back surfaces of the lower build-up board 15a, may be formed on the lower build-up board 15a on which the upper build-up board 15b is stacked. The board 10 having the recessed portion 12 and the heat conduction path 70c is formed by stacking the upper build-up board 15b on the lower build-up board 15a. In addition, the board 10 having the recessed portion 12 and the heat conduction path 70d is formed by forming the heat conduction layer 75 on the sidewall 12a (or the sidewall 12a and the bottom surface 12b) of the recessed portion 12 by using the plating method or the sputtering method.

Figure 14A:
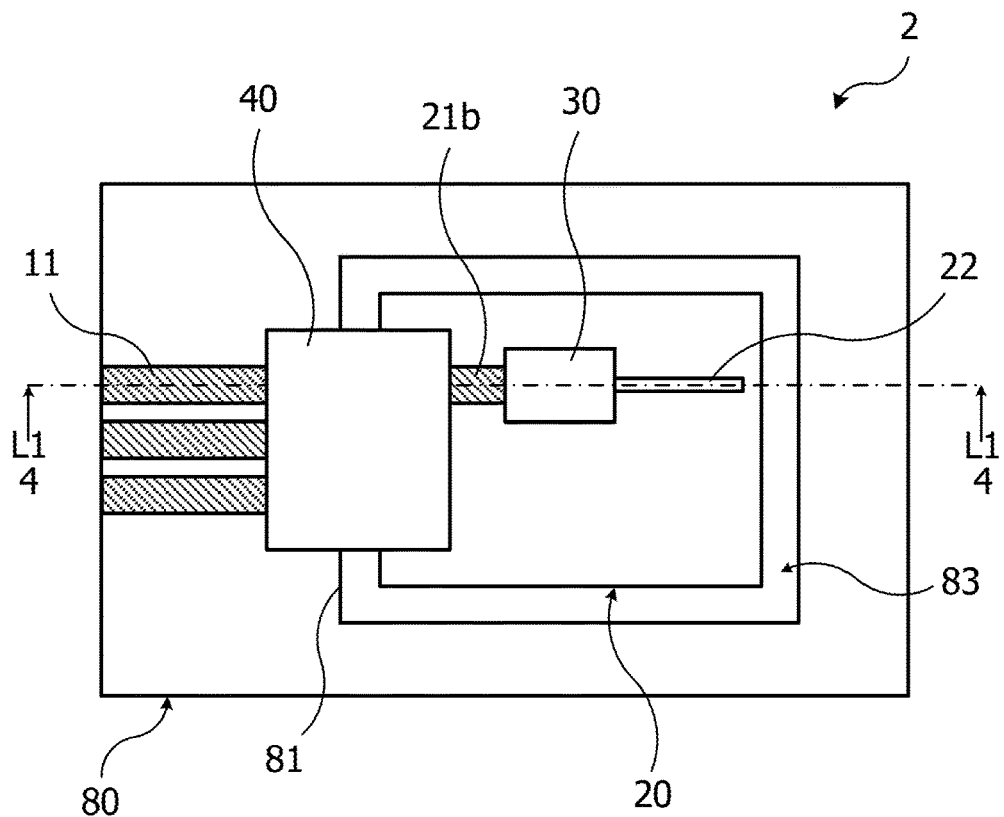
FIGS. 14A and 14B are views illustrating an example of an optical module according to a second embodiment.
Figure 14B:
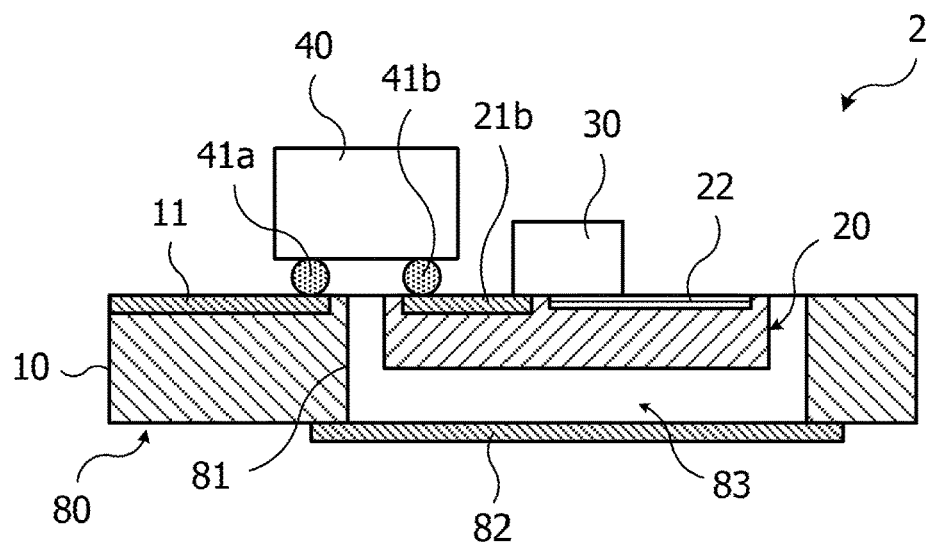

Next, a second embodiment will be described. FIGS. 14A and 14B are views illustrating an example of an optical module according to the second embodiment. FIG. 14A illustrates a schematic top plan view of a main part of the optical module, and FIG. 14B illustrates a schematic cross-sectional view taken along line L14-L14 in FIG. 14A.

An optical module 2 illustrated in FIGS. 14A and 14B includes a board 80, a silicon photonics chip 20, a semiconductor laser 30, and a control chip 40. The board 80 of the optical module 2 includes a board 10 (base material) which has conductor layers 11 having predetermined patterns and a through hole 81, and a bottom plate 82 (blocking member) which blocks an opening end at one side of the through hole 81. For example, a metallic material is used for the bottom plate 82. A recessed portion 83, which accommodates the silicon photonics chip 20, is formed in the board 80 by the through hole 81 and the bottom plate 82.

In the optical module 2, the silicon photonics chip 20 is accommodated in the recessed portion 83 formed by the through hole 81 and the bottom plate 82, and the control chip 40 is formed across the board 80 and the silicon photonics chip 20. The control chip 40 is electrically connected to the conductor layer 11 of the board 80 by a terminal joint portion 41a such as a solder bump, and electrically connected to a conductor layer 21b of the silicon photonics chip 20 by a terminal joint portion 41b such as a solder bump. The semiconductor laser 30 is provided on the silicon photonics chip 20, electrically connected to the conductor layer 21b, and optically connected to an optical waveguide 22.

The optical module 2 has the bridge structure in which the board 80, which has the recessed portion 83 formed by the through hole 81 and the bottom plate 82, and the silicon photonics chip 20, which is accommodated in the recessed portion 83, are bridged by the control chip 40. Similar to the description of the first embodiment, even in the optical module 2, a reduction in wiring length is achieved by the bridge structure of the control chip 40, a high-speed operation according to the reduction in wiring length is achieved, and a reduction in costs and miniaturization are achieved because wire bonding is not required.

As described in the first embodiment (first to fifth configuration examples thereof), various types of bonding materials may be provided between the board 80 of the optical module 2 and the silicon photonics chip 20 accommodated in the recessed portion 83.

Figure 15:
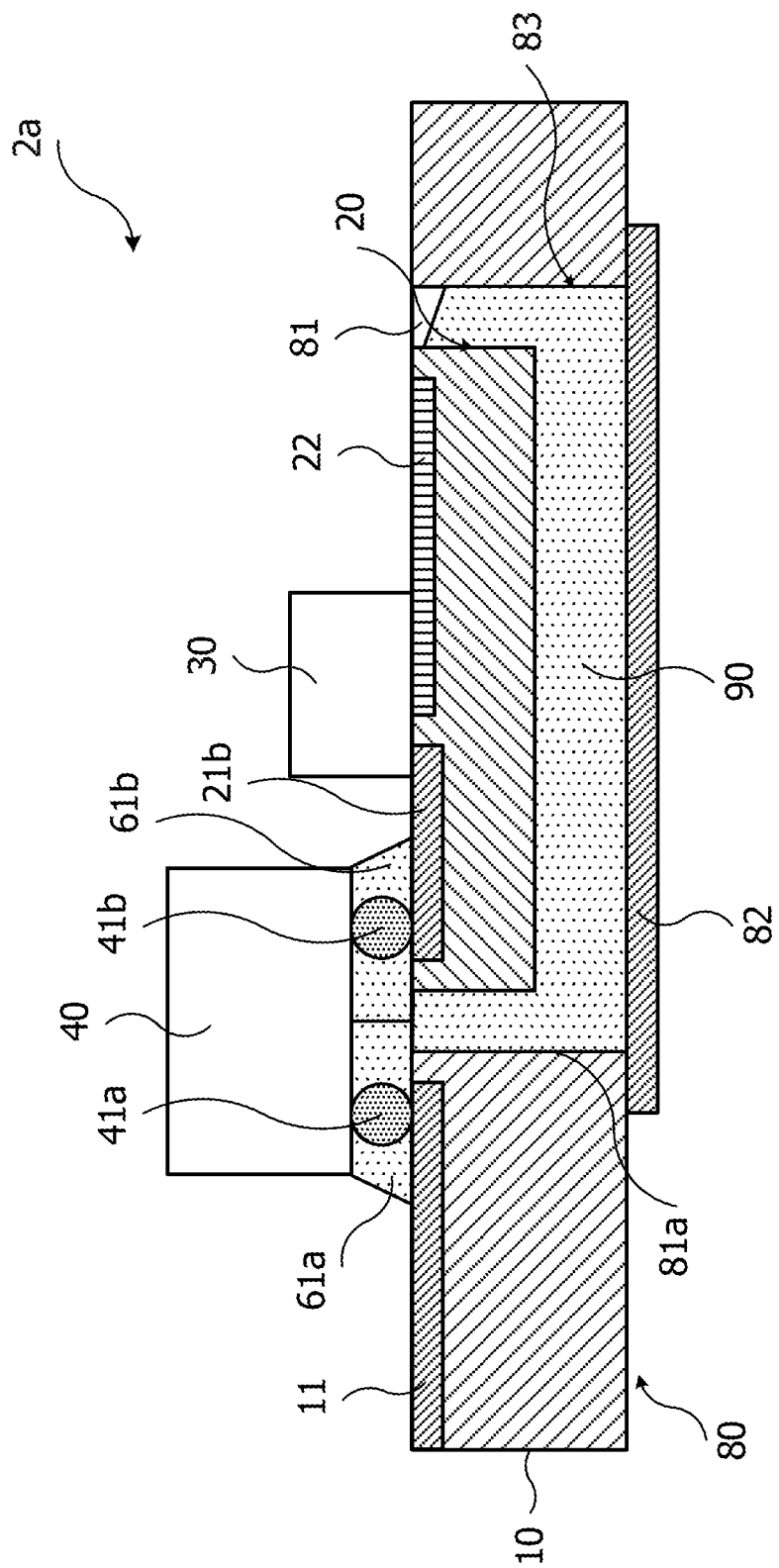
FIG. 15 is a view illustrating a configuration example of the optical module according to the second embodiment.

FIG. 15 is a view illustrating a configuration example of the optical module according to the second embodiment. FIG. 15 illustrates a schematic cross-sectional view of a main part of the optical module. An optical module 2a illustrated in FIG. 15 has a configuration in which a bonding material 90 is provided between the board 80 and the silicon photonics chip 20 accommodated in the recessed portion 83. The bonding material 90 is provided between a sidewall 81a of the through hole 81 and the silicon photonics chip 20 and between the bottom plate 82 and the silicon photonics chip 20.

In the optical module 2a illustrated in FIG. 15, a reduction in wiring length is achieved by the bridge structure of the control chip 40, and a high-speed operation, miniaturization, and a reduction in costs are achieved by the reduction in wiring length. Furthermore, in the optical module 2a, high strength is achieved by the bonding material 90, and the fracture of the terminal joint portions 41b and 41a is inhibited by the high strength.

Here, various types of resin materials such as thermosetting resin, thermoplastic resin, and photocurable resin may be used as the bonding material 90. A material including resin and fillers having higher thermal conductivity than the resin may be used as the bonding material 90. In the case in which the bonding material 90 including the fillers is used, heat, which is generated from the semiconductor laser 30 and the control chip 40 and transferred to the silicon photonics chip 20, may be effectively transferred to the bottom plate 82. Furthermore, in the case in which a material such as metal having comparatively high thermal conductivity is used for the bottom plate 82, the bottom plate 82 serves as a heat conduction path that passes through the board 80 from the recessed portion 83 of the board 80 to an outer surface of the board 80, thereby improving efficiency in heat dissipation to the outside of the optical module 2a. Since the bonding material 90 including the resin and the fillers having higher thermal conductivity than the resin is used, heat dissipation for the semiconductor laser 30 and the control chip 40 is improved, and as a result, it is possible to inhibit deterioration in performance and damage of the semiconductor laser 30 and the control chip 40 caused by overheating.

By using the material including the resin and the fillers as the bonding material 90, it is possible to inhibit curing shrinkage of the bonding material 90, and to inhibit the fracture of the terminal joint portions 41b and 41a caused by stress resulting from the curing shrinkage of the bonding material 90. Furthermore, the curing shrinkage of the bonding material 90 may be effectively inhibited as the amount of fillers is increased, and in a case in which the fillers have thermal conductivity, heat conduction efficiency of the bonding material 90 is increased, such that heat dissipation for the semiconductor laser 30 and the control chip 40 may be improved.

The heat conduction layer made of a metal or the like which is wet by the molten solder is provided on the lateral surface and the bottom surface of the silicon photonics chip 20 and the sidewall 81a of the through hole 81 of the board 80, and the bottom plate 82 made of metal serves as a heat conduction path by using the solder for the bonding material 90. As such, heat dissipation for the semiconductor laser 30 and the control chip 40 may be improved by improving efficiency in heat dissipation to the outside of the optical module 2a.

Figure 16A:
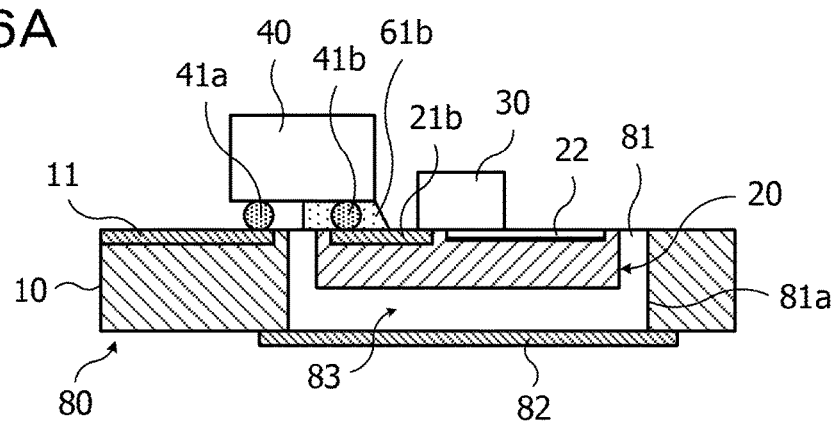
FIGS. 16A to 16C are views illustrating an example of a method of forming the optical module according to the second embodiment.
Figure 16B:
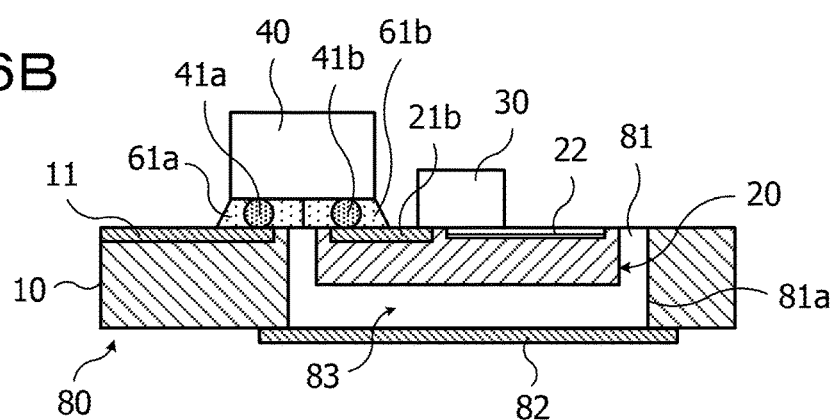
Figure 16C:
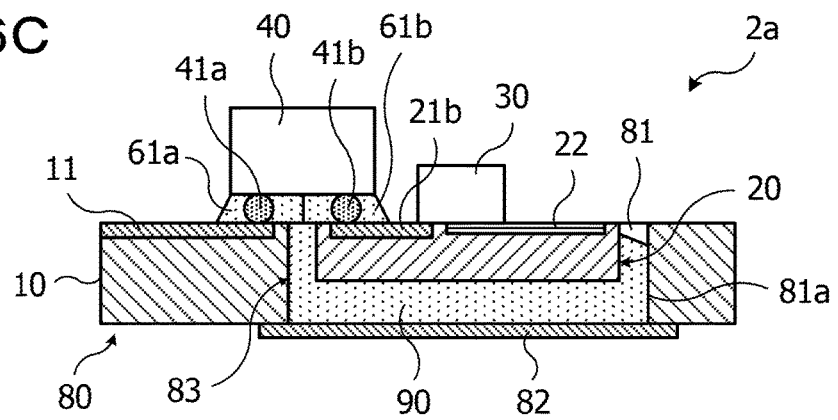

Next, a method of forming the optical module 2a will be described with reference to the example of the optical module 2a. FIGS. 16A to 16C are views illustrating an example of a method of forming the optical module according to the second embodiment. FIGS. 16A to 16C illustrate schematic cross-sectional views illustrating main parts in the steps of forming the optical module, respectively.

To form the optical module 2a, for example, first, as illustrated in FIGS. 11A and 11B, the silicon photonics chip 20 on which the semiconductor laser 30 and the control chip 40 are mounted is prepared. That is, the semiconductor laser 30 is bonded to the conductor layer 21b by solder or the like in a state in which an optical axis of the semiconductor laser 30 coincides with an optical axis of the optical waveguide 22, and the control chip 40 is partially bonded to the conductor layer 21b by the terminal joint portion 41b (FIG. 11A). The resin having fluidity and turned into the underfill material 61b is supplied and cured between the bonded control chip 40 and the bonded silicon photonics chip 20 (FIG. 11B).

As illustrated in FIG. 16A, the control chip 40, which is bonded to the silicon photonics chip 20 by the terminal joint portion 41b, is mounted on the board 80 having the conductor layer 11 and the recessed portion 83. The silicon photonics chip 20 is accommodated in the recessed portion 83 of the board 80, and the control chip 40 is bonded to the conductor layer 11 of the board 80 by the terminal joint portion 41a.

As illustrated in FIG. 16B, a underfill material 61a is provided between the control chip 40 and the board 80 which are bonded to each other by the terminal joint portion 41a. For example, the resin having fluidity and turned into the underfill material 61a is supplied and cured between the control chip 40 and the board 80 which are bonded to each other by the terminal joint portion 41a.

As illustrated in FIG. 16C, the material having fluidity and turned into various types of bonding materials 90 is supplied and cured between the board 80 and the silicon photonics chip 20 which are bridged by the control chip 40.

The optical module 2a may be obtained by the steps illustrated in FIGS. 11A and 11B and FIGS. 16A to 16C. Meanwhile, here, the example in which the underfill materials 61a and 61b are formed by separate steps has been described. In addition, the same resin may be simultaneously supplied and cured between the control chip 40 the silicon photonics chip 20 and the board 80, which are bonded to each other by the terminal joint portions 41b and 41a without providing the underfill materials 61a and 61b. Therefore, the control chip 40, the board 80, and the silicon photonics chip 20 are bonded by the integrated underfill materials 61a and 61b, and as a result, the reduction of the number of steps and the improvement of the bonding strength are achieved.

According to the example illustrated in FIGS. 12A and 12B, the same resin may be simultaneously supplied and cured between the control chip 40 and the board 80 and the silicon photonics chip 20 which are bonded to each other by the terminal joint portions 41b and 41a and between the board 80 and the silicon photonics chip 20. Therefore, the board 80, the silicon photonics chip 20, and the control chip 40 are bonded by the integrated bonding material 90 and the integrated underfill materials 61a and 61b, and as a result, the reduction of the number of steps and the improvement of the bonding strength are achieved.

Figure 17A:
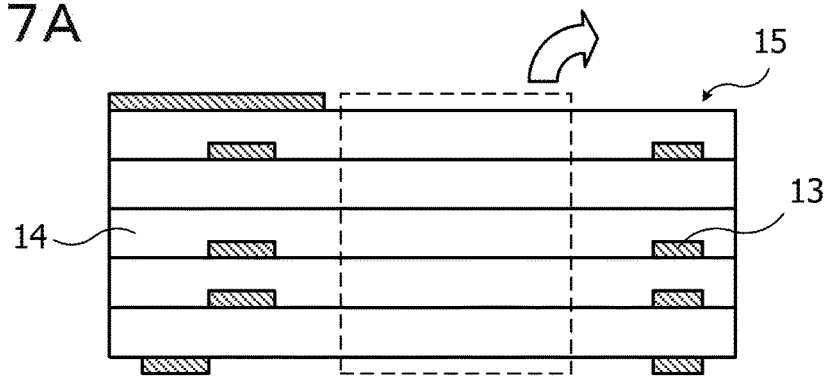
FIGS. 17A to 17C are explanatory views of a method of forming a board according to the second embodiment.
Figure 17B:
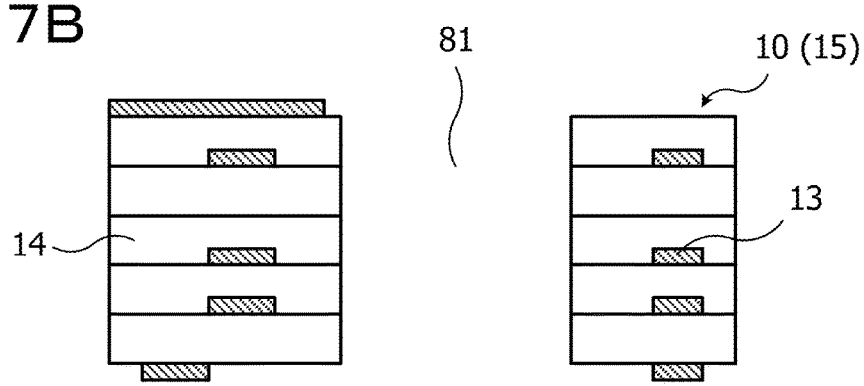
Figure 17C:
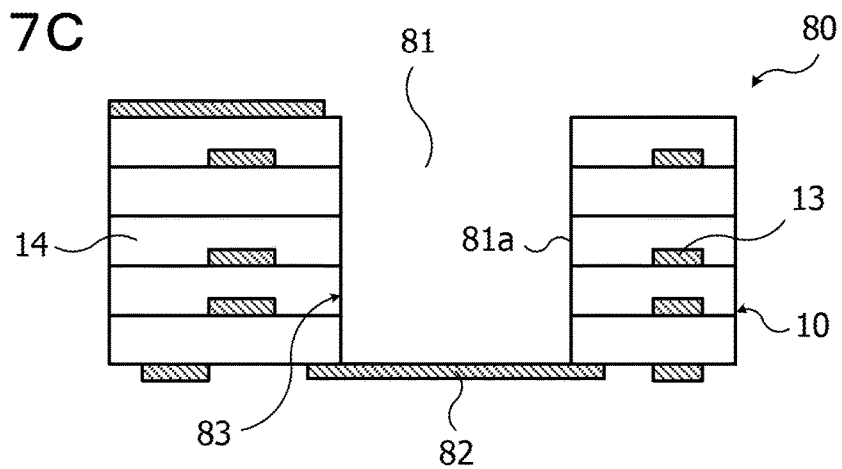

The board 80 may be formed as follows. FIGS. 17A to 17C are explanatory views of a method of forming a board according to the second embodiment. FIGS. 17A to 17C illustrate schematic cross-sectional views of main parts in the steps of forming the board, respectively.

For example, first, as illustrated in FIG. 17A, a build-up board 15 on which a group of insulating layers 14 (a core layer and a build-up layer) each having conductor layers 13 having predetermined patterns are stacked is formed.

A part of the formed build-up board 15 (illustrated by a dotted line frame in FIG. 17A) is penetratively removed by drilling or laser processing, and as a result, the board 10 having the through hole 81 is formed as illustrated in FIG. 17B.

As illustrated in FIG. 17C, an opening end at one side of the through hole 81 of the board 10 having the through hole 81 is blocked by the bottom plate 82. Therefore, the board 80 having the recessed portion 83 formed by the through hole 81 and the bottom plate 82 is formed.

In the case in which the heat conduction layer made of metal is formed on the sidewall 81a of the through hole 81 (the solder is used for the bonding material 90), the through hole 81 may be formed in the build-up board 15 by drilling or laser processing, and then the heat conduction layer may be formed on the sidewall 81a by using the plating method or the sputtering method.

The board 80 may have the recessed portion 83 formed by forming the through hole 81 in the build-up board 15 and blocking the through hole 81 by the bottom plate 82. For this reason, the board 80 having the recessed portion 83 may be obtained comparatively conveniently.

Next, a third embodiment will be described. The optical modules 1, 1a, 1b, 1c, 1d, 1e, 2, and 2a having the configurations described in the first and second embodiments may be mounted in various types of electronic apparatuses. For example, the optical modules may be used for various types of electronic apparatuses such as computers (personal computers, super computers, servers, etc.), smartphones, mobile phones, tablet terminals, sensors, cameras, audio devices, measuring devices, inspection devices, and manufacturing devices.

Figure 18:
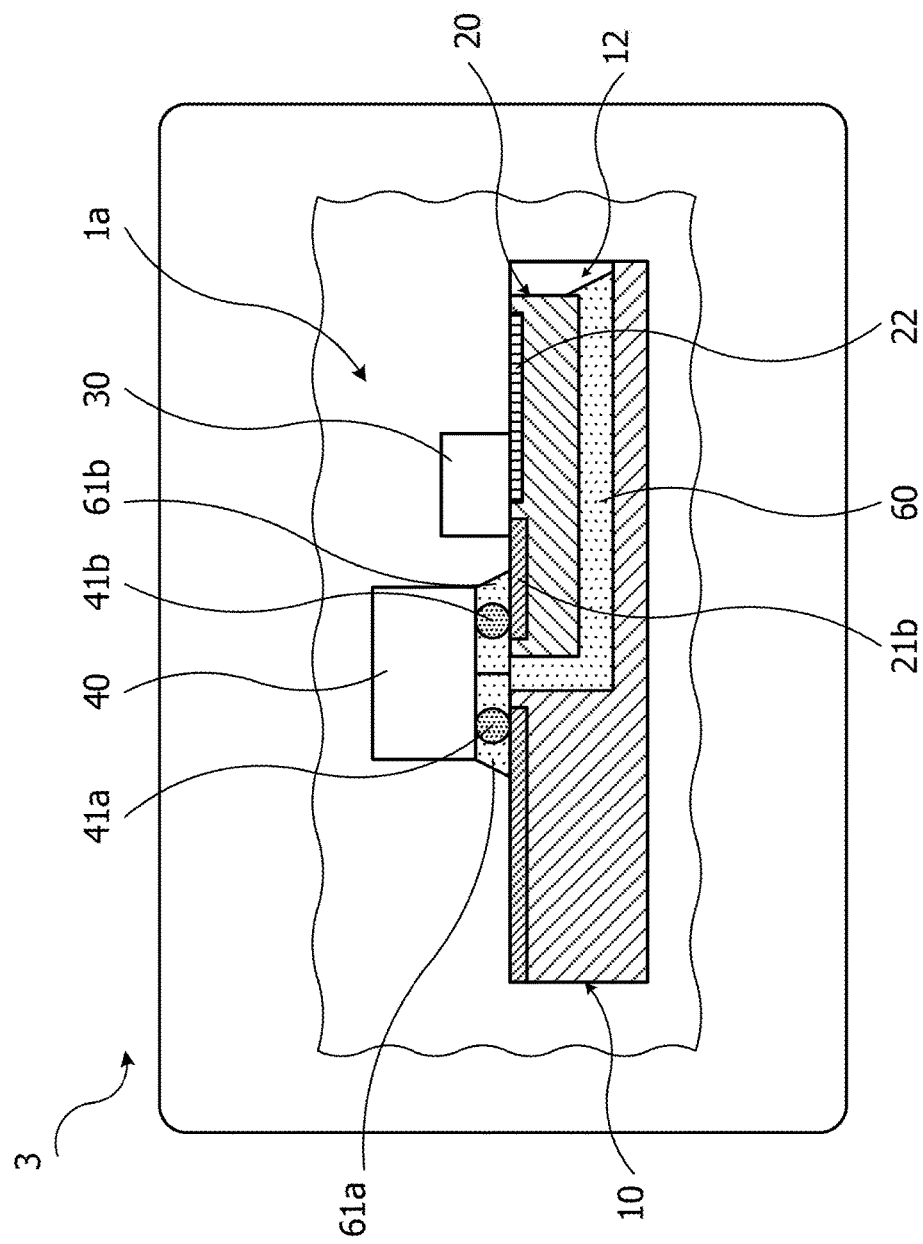
FIG. 18 is an explanatory view of an electronic apparatus according to a third embodiment.

FIG. 18 is an explanatory view of an electronic apparatus according to a third embodiment. FIG. 18 schematically illustrates an example of an electronic apparatus.

As illustrated in FIG. 18, for example, the optical module 1a illustrated in FIGS. 6A and 6B is mounted (embedded) in various types of electronic apparatuses 3. In the optical module 1a, the control chip 40 is formed across the board 10 and the silicon photonics chip 20 accommodated in the recessed portion 12 of the board 10. Therefore, a wiring length between the board 10 and the control chip 40 is shortened and a high-speed operation of the optical module 1a is implemented in comparison with the case in which the control chip 40 is provided on the silicon photonics chip 20 such that the board 10 and the silicon photonics chip 20 are bonded by wire bonding. Furthermore, since the wire bonding is not required, miniaturization and a reduction in costs of the silicon photonics chip 20 are enabled, and as a result, miniaturization and a reduction in costs of the optical module 1a is implemented.

Since the board 10 and the silicon photonics chip 20 are bonded by the bonding material 60, stresses are inhibited from being generated on the terminal joint portions 41a and 41b of the control chip 40, and the fracture of the terminal joint portions 41a and 41b caused by the stresses is inhibited. Therefore, the high strength, the performance, and the reliability of the optical module 1a are improved.

The electronic apparatus 3, which has the optical module 1a mounted therein and thus has excellent performance and reliability, is implemented. Here, the optical module 1a has been described as an example, but the other optical modules 1, 1b, 1c, 1d, 1e, 2, and 2a described in the first and second embodiments may be also mounted in various types of electronic apparatuses.

In the aforementioned description, the single semiconductor laser 30 is exemplified as an optical element provided on the silicon photonics chip 20, but one or more element of various types of light receiving elements, a light emitting element, and a light receiving and emitting element, such as a photo diode (PD) and a light emitting diode (LED), may be provided on the silicon photonics chip 20.

A plurality of optical waveguides 22 may be provided on the silicon photonics chip 20 without being limited to the single optical waveguide 22. In addition, the optical waveguide 22, which is curved or has a curved portion, may be provided on the silicon photonics chip 20 without being limited to the optical waveguide 22 having a straight shape. Furthermore, a modulator for modulating light to be transmitted to the optical waveguide 22 may be provided on the silicon photonics chip 20.

The recessed portion 12 of the board 10 and the recessed portion 83 of the board 80 are sized to be able to accommodate the silicon photonics chip 20, and may have various types of planar shapes without being limited to the planar rectangular shape as long as the bridge structure may be implemented by the control chip 40.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
a first board that includes a recessed portion and a first conductor layer;
a second board accommodated in the recessed portion and includes an optical waveguide and a second conductor layer on a surface of the second board;
a semiconductor laser installed on the second board and coupled to the optical waveguide;
a semiconductor element installed across the first board and the second board and coupled to the first conductor layer and the second conductor layer; and
a first bonding material disposed between a sidewall and a bottom surface of the recessed portion and the second board so as to bond the first board and the second board to each other.

2. The optical module according to claim 1, wherein the first board includes a base material having the first conductor layer, a through hole which penetrates the base material, and a blocking member which blocks an opening end at one side of the through hole, and the recessed portion is formed by the through hole and the blocking member.

3. The optical module according to claim 1, wherein the first bonding material includes a resin.

4. The optical module according to claim 3, wherein the first bonding material includes fillers contained in the resin.

5. The optical module according to claim 4, wherein the fillers have higher thermal conductivity than the resin.

6. The optical module according to claim 1, wherein the first board has a heat conduction path formed from the bottom surface of the recessed portion to an outer surface of the first board using a material having higher thermal conductivity than an insulating portion of the first board.

7. The optical module according to claim 1, further comprising:
a second bonding material disposed between the semiconductor element and the first board; and
a third bonding material disposed between the semiconductor element and the second board,
wherein the first bonding material, the second bonding material, and the third bonding material are bonded to each other.

* * * * *